(12) United States Patent
Nakata

(10) Patent No.: US 6,204,545 B1
(45) Date of Patent: Mar. 20, 2001

(54) SEMICONDUCTOR DEVICE

(76) Inventor: Josuke Nakata, 112-17 Kamiootani Kuse, Jyoyo-shi, Kyoto, 610-01 (JP)

( * ) Notice: Subject to any disclaimer, the term of this patent is extended or adjusted under 35 U.S.C. 154(b) by 0 days.

(21) Appl. No.: 09/077,656

(22) PCT Filed: Oct. 9, 1996

(86) PCT No.: PCT/JP96/02948
§ 371 Date: Jun. 8, 1998
§ 102(e) Date: Jun. 8, 1998

(87) PCT Pub. No.: WO98/15983
PCT Pub. Date: Apr. 16, 1998

(51) Int. Cl.[7] ............... H01L 31/0352; H01L 31/0224
(52) U.S. Cl. ..................... 257/459; 257/466; 136/250
(58) Field of Search ............................. 136/250; 257/466, 257/459

(56) References Cited

U.S. PATENT DOCUMENTS

| | | | | |
|---|---|---|---|---|
| 3,025,335 | * | 3/1962 | Ralph | 136/250 |
| 3,350,775 | * | 11/1967 | Iles | 257/459 |
| 3,998,659 | | 12/1976 | Wakefield . | |
| 4,021,323 | | 5/1977 | Kilby et al. . | |
| 4,100,051 | | 7/1978 | Kilby et al. . | |
| 4,136,436 | | 1/1979 | Kilby et al. . | |
| 4,173,494 | * | 11/1979 | Johnson | 136/250 |
| 4,358,782 | * | 11/1982 | Takasuka | 257/449 |
| 5,037,105 | | 8/1991 | Klein . | |
| 5,469,020 | * | 11/1995 | Herrick | 257/72 |

FOREIGN PATENT DOCUMENTS

| | | |
|---|---|---|
| 0396266 | 11/1990 | (EP) . |
| 50-124586 | 9/1975 | (JP) . |
| 50-137488 | 10/1975 | (JP) . |
| 52-17229 | 2/1977 | (JP) . |
| 53-43885 | 4/1978 | (JP) . |
| 60-41063 | 3/1985 | (JP) . |
| 61-220482 | 9/1986 | (JP) . |
| 329685 | 2/1991 | (JP) . |
| 5-36997 | 2/1993 | (JP) . |
| 5-53511 | 3/1993 | (JP) . |
| 6302853 | 10/1994 | (JP) . |
| 8064860 | 3/1996 | (JP) . |
| 8125210 | 5/1996 | (JP) . |

OTHER PUBLICATIONS

Maugh, "Fuels from Solar Energy . . . " *Science:* Oct. 14, 1983, pp. 151–153.*

Johnson, "The Texas Ins. . . . Development" Conf. Proc. 16th Int. En. Conv. Engin. Conf. Atlanta GA. pp. 798–804, Aug. 1981.*

* cited by examiner

Primary Examiner—Jerome Jackson, Jr.
(74) Attorney, Agent, or Firm—Morrison Law Firm

(57) ABSTRACT

The present invention is a semiconductor device which has one or a plurality of spherical semiconductor elements as its main component. The spherical semiconductor element is a spherical semiconductor crystal with a photovoltaic part and a pair of electrodes. The present invention is also a semiconductor device of a semiconductor photocatalyst, photodiode or solar battery. The present invention is also a semiconductor device which has one or a plurality of spherical semiconductor elements as its main component. This spherical semiconductor element is a spherical semiconductor crystal with a pn junction and a pair of electrodes. Semiconductor devices of light-emitting diodes, various diodes, or display panels are disclosed. Referring to semiconductor photocatalyst 1 of the figure, a p-type diffusion layer 6 and a pn junction 7 is formed on an n-type silicon semiconductor spherical crystal. There is formed a micro photocell 17 which includes: photovoltaic part 16; a pair of electrodes 14, 15 which are opposite each other and which sandwiches the center of spherical crystal 2; a SiO2 coating 9; a TiO2 coating 10 which has photocatalytic function.

37 Claims, 16 Drawing Sheets

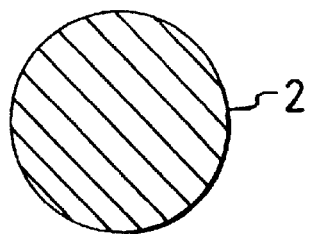
F I G. 1
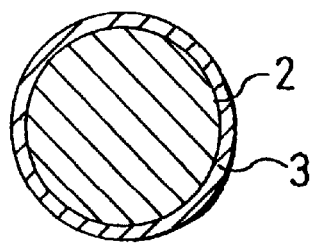
F I G. 2
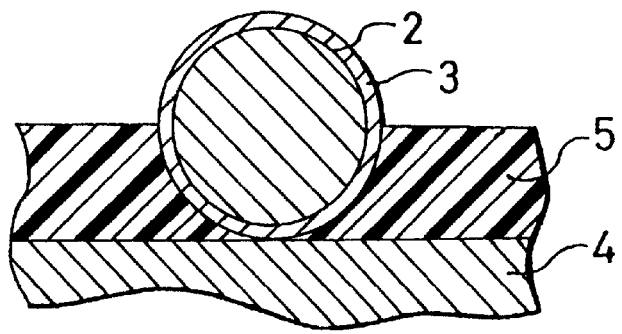
F I G. 3
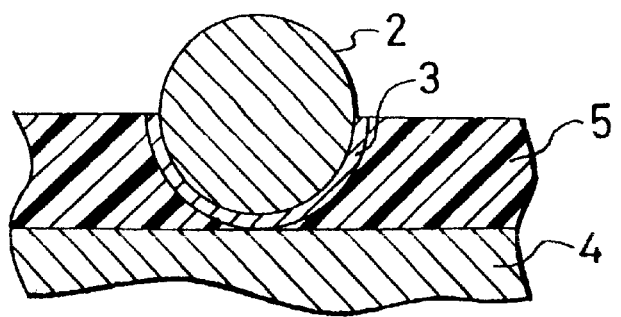
F I G. 4

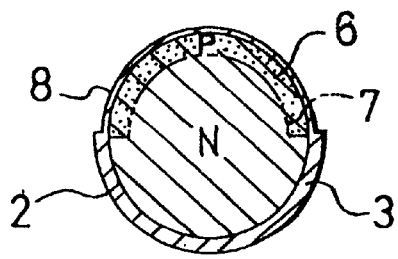
F I G. 5
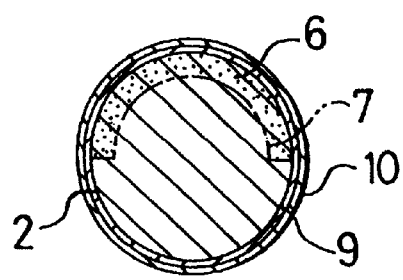
F I G. 6
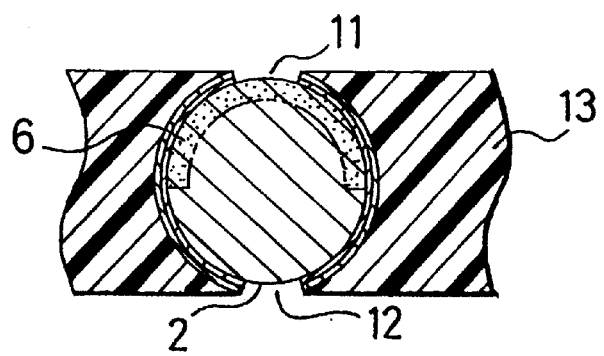
F I G. 7
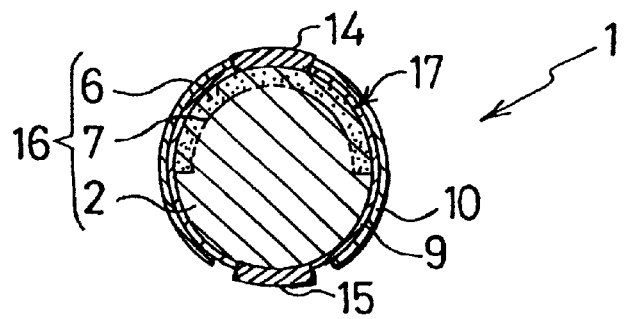
F I G. 8

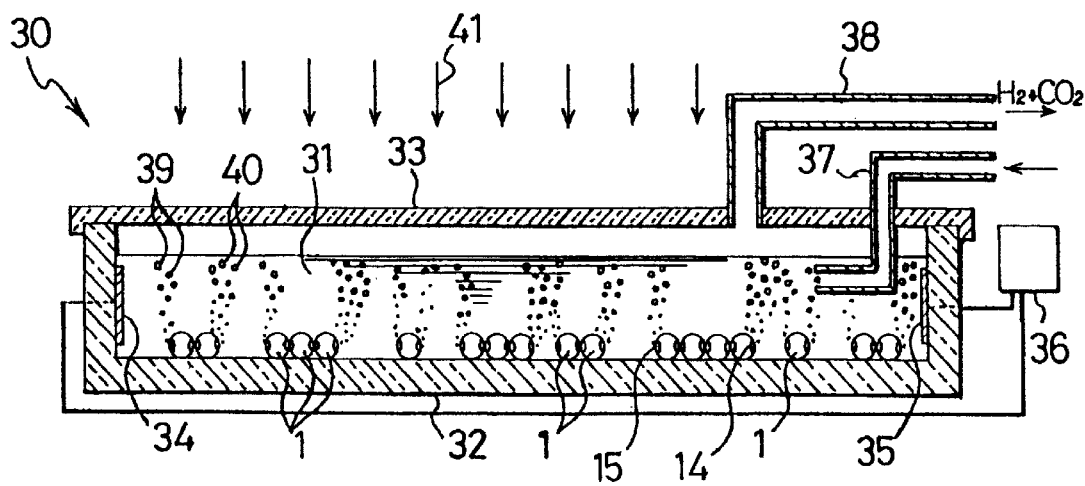
F I G. 1 5
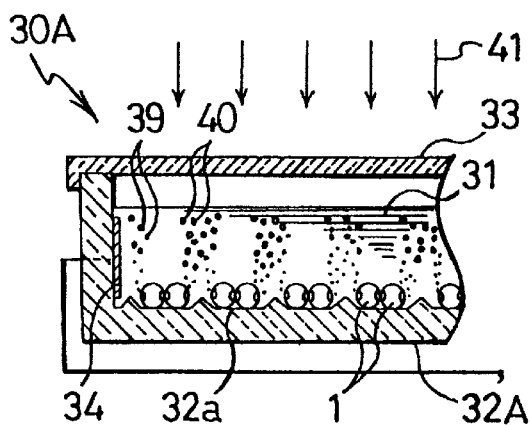
F I G. 1 6
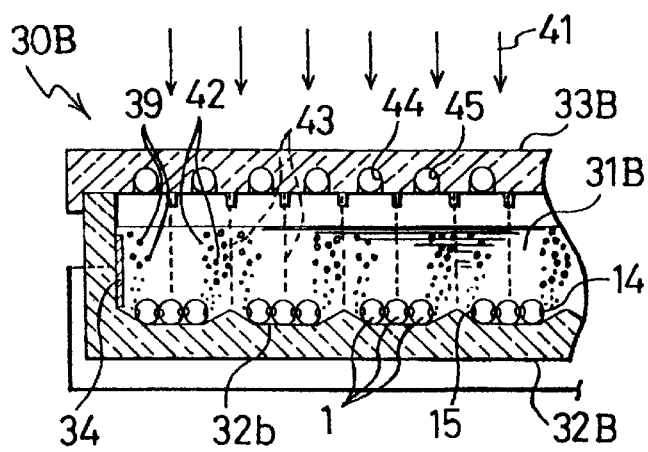
F I G. 1 7

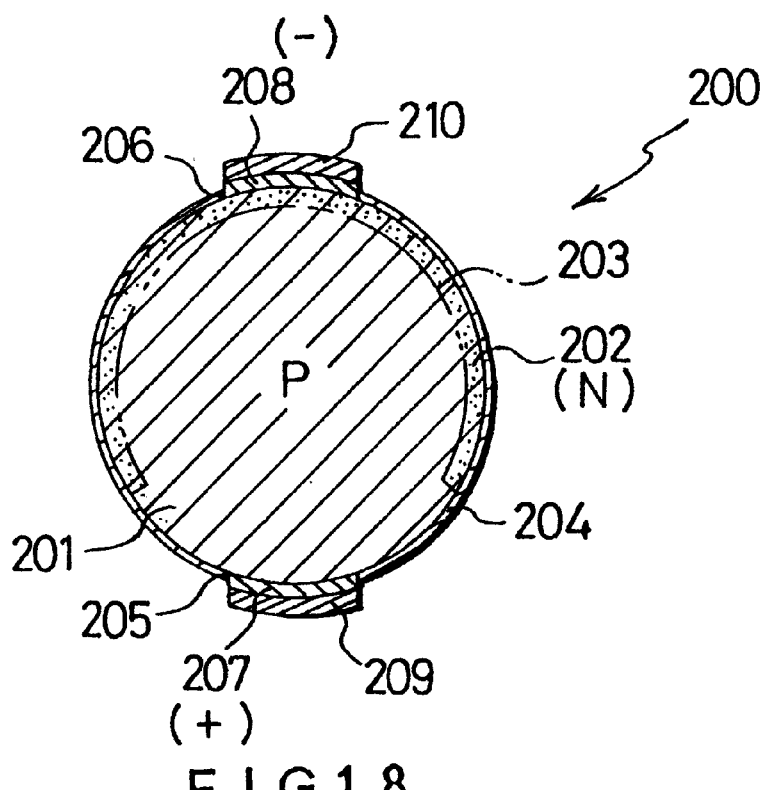
F I G. 1 8
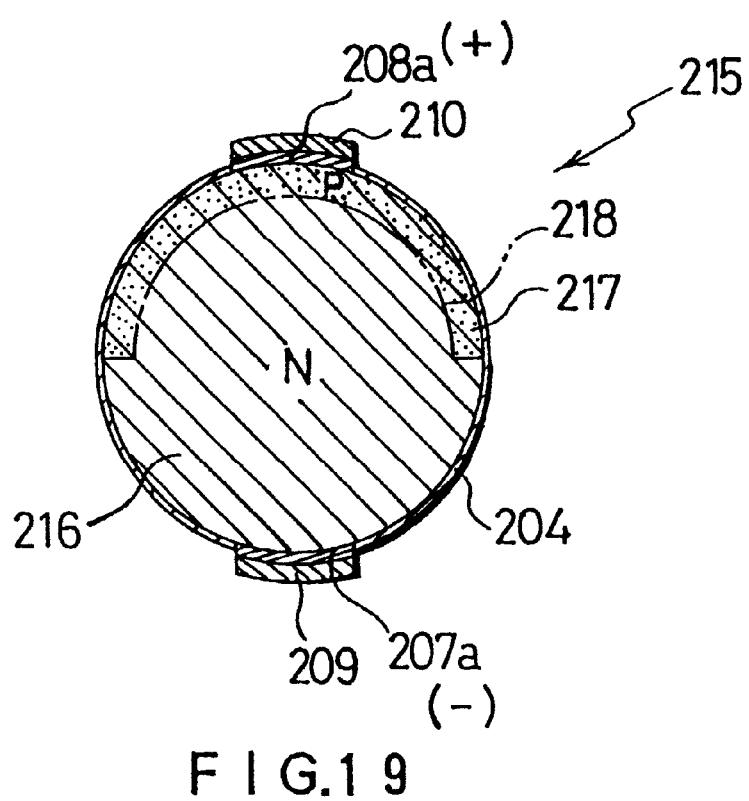
F I G. 1 9

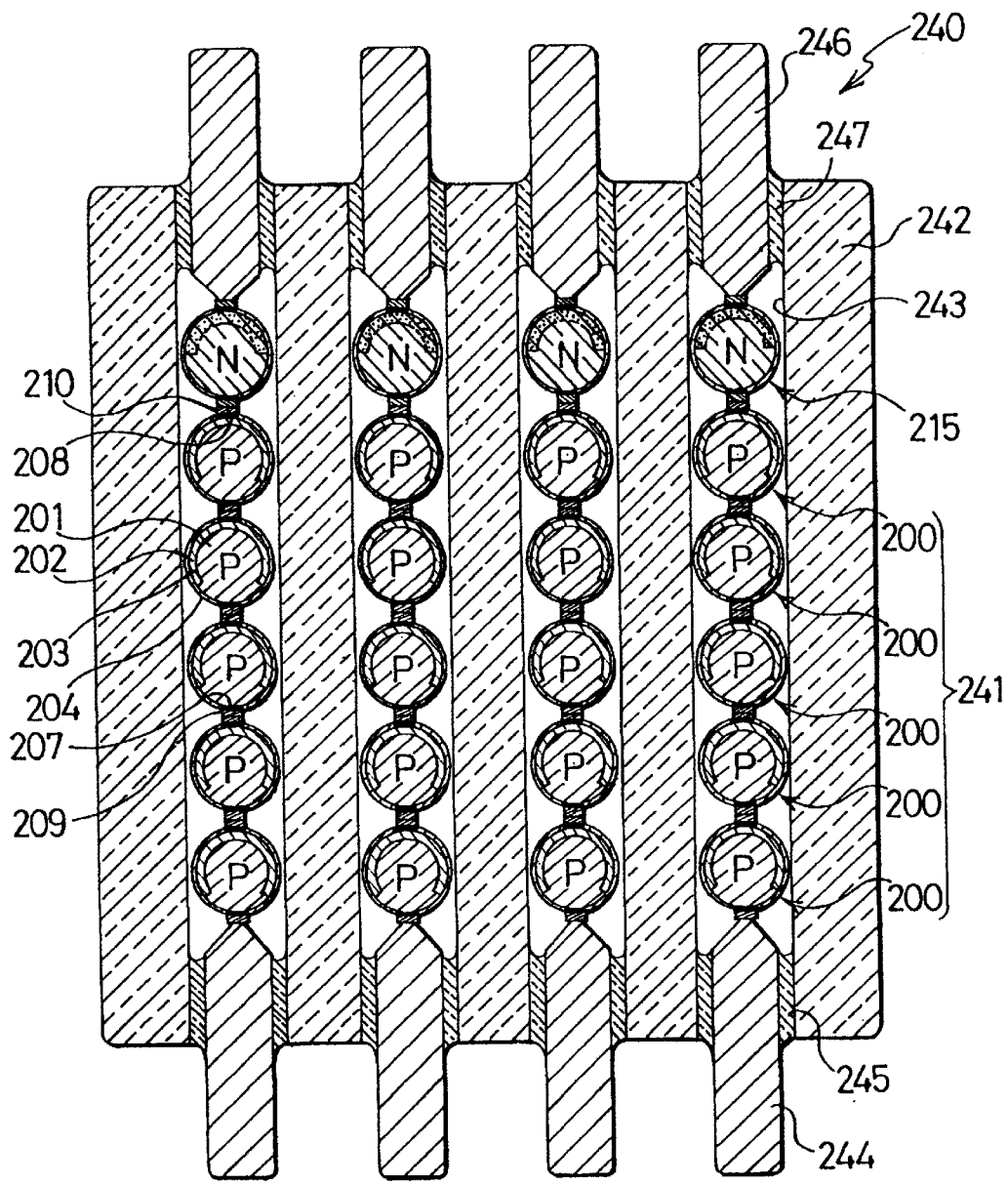
F I G. 2 4
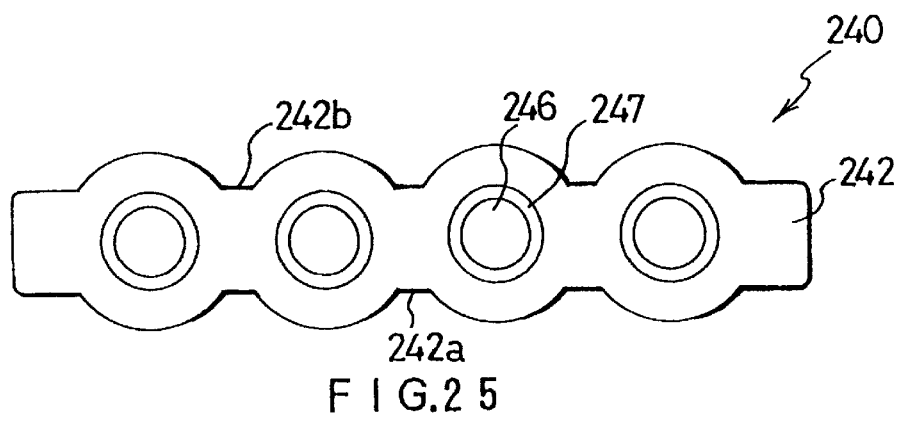
F I G. 2 5

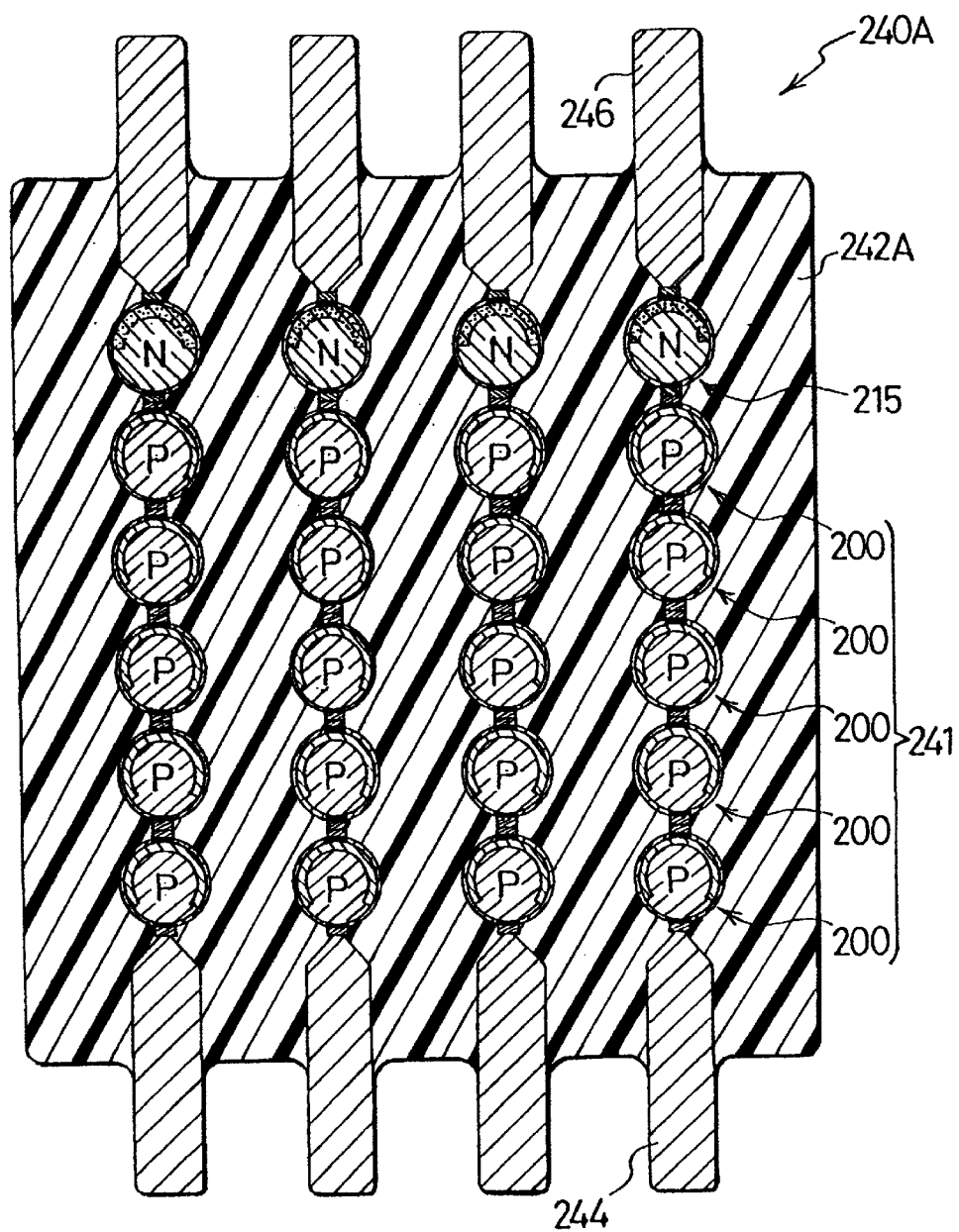
F I G. 2 6
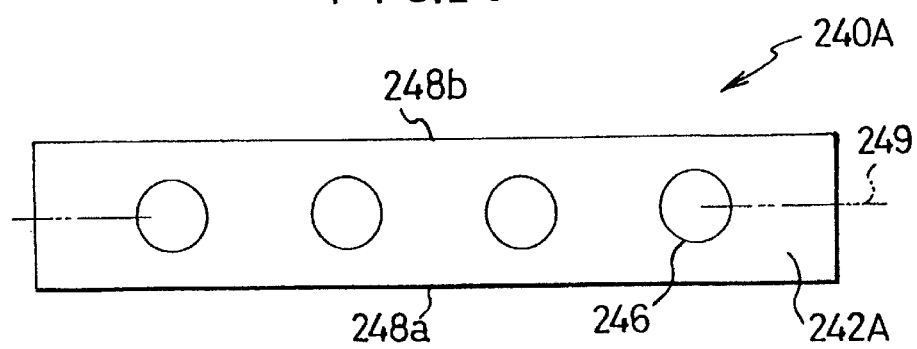
F I G. 2 7

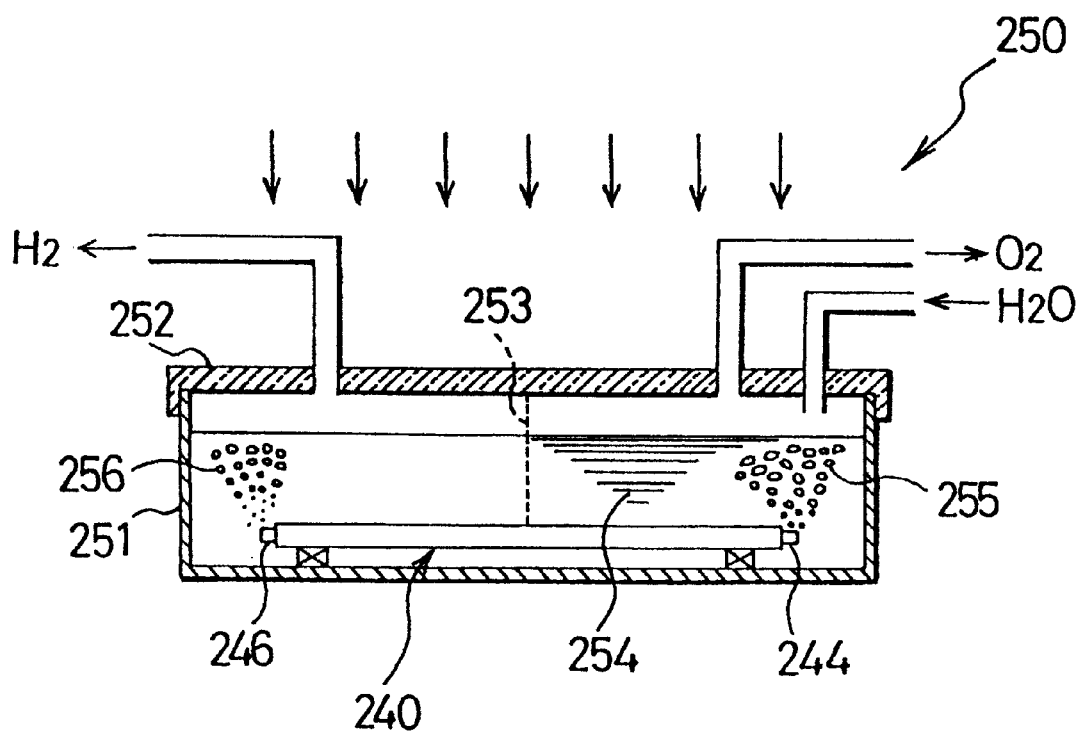
F I G. 2 8

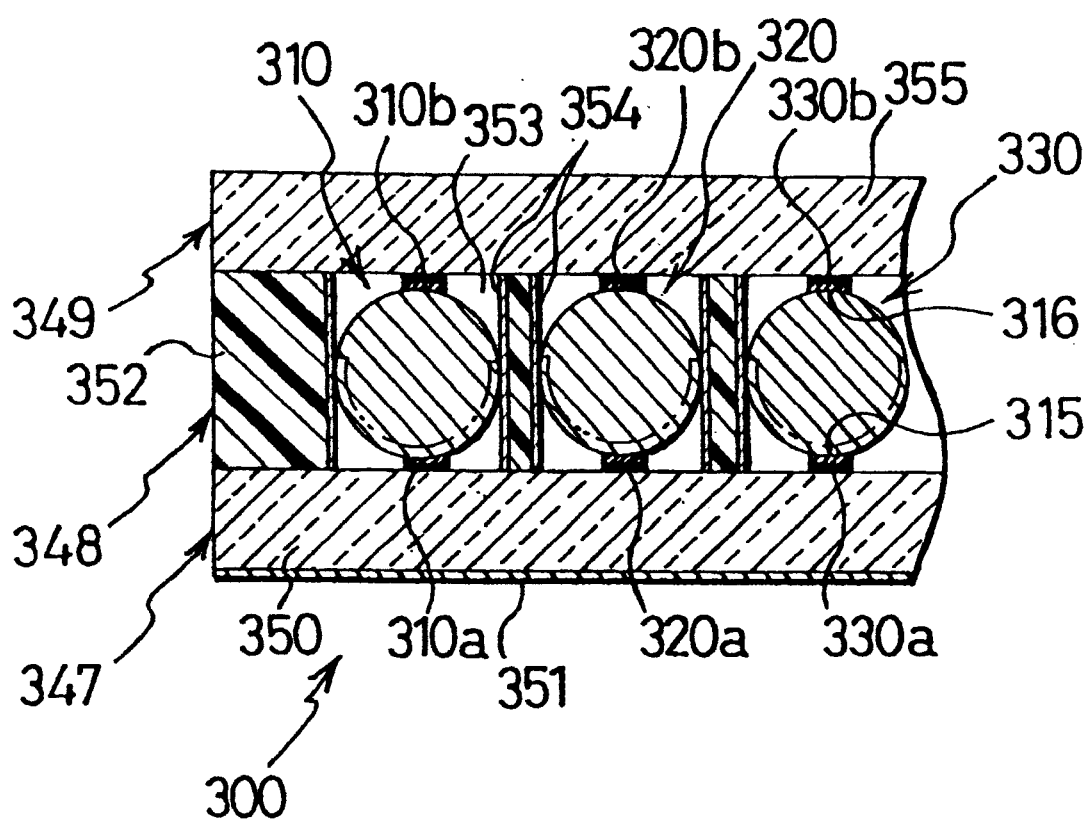
F I G. 3 5

SEMICONDUCTOR DEVICE

TECHNICAL FIELD

The present invention relates to a semiconductor device, comprising: bead-like, spherical semiconductor elements which incorporate a pn-junction into a spherical crystal of a semiconductor and which have a pair of electrodes. The present invention further relates to a semiconductor device which can be used in semiconductor photocatalysts, solar batteries, display panels, or other various applications.

BACKGROUND TECHNOLOGY

Semiconductor photocatalysts receive light from sunlight or the like and generate photovoltage. An electrochemical reaction is triggered by this photovoltage. Metal oxide semiconductors of titanium oxide ($TiO_2$), strontium titanate ($SrTiO_2$), or the like have been utilized as semiconductor photocatalysts. Titanium oxide is used as an electrode of a photochemical battery. A platinum electrode and a titanium oxide electrode are placed in water. When light is shined on the titanium oxide electrode, electrolysis of water is known to occur. Furthermore, there has been research on photocatalysts in which metals such as platinum are supported by a powder of a metal oxide semiconductor as well as research on electrodes comprising a thin film of titanium oxide on one side of a titanium plate.

When using a titanium oxide photocatalyst for the electrolysis of water by sunlight, only the portion of the spectrum which is approximately 410 nm or lower can be used from the entire light spectrum of sunlight. As a result, the photoelectric conversion efficiency is extremely low. The following are conditions which are necessary for a semiconductor photocatalyst or semiconductor electrode to be able to electrolyze water and for it to be able to adequately utilize the spectrum of sunlight: a photovoltage greater than or equal to the electrolytic voltage of water (theoretical value 1.23 V); a chemical stability so that there is no photodissociation of the semiconductor photocatalyst in the electrolyte solution, and the like.

Because the energy band gap of metal oxide semiconductors of titanium oxide or the like is large, it has the advantages of the electrolysis of water being possible and of not dissolving in the electrolyte solution. However, there is a problem because it does not function as a photocatalyst with the light spectrum when the wavelength is longer than approximately 410 nm. As a result, when conducting chemical reactions using sunlight for the photocatalytic action, only a small portion of the light spectrum of sunlight can be used, and the energy conversion efficiency becomes extremely poor. In order to increase catalytic efficiency, the photocatalyst of titanium oxide or the like is used in the form of a fine powder. However, this flows easily in the electrolyte solution, and as a result, recovery for the purpose of reuse is difficult. With regard to a photocatalyst in which a metal of platinum or the like is supported by a titanium oxide powder, because the anode site (site of oxidation reaction) and the cathode site (site of reduction reaction) exist close to each other, the probability of the reverse reaction is large. This is not very practical.

In U.S. Pat. No. 4,021,323, there is described a technology, wherein: small amounts of molten silicon solution are sprayed from a small nozzle which is placed on the upper end of a shot tower; silicon solution is allowed to free fall, and spherical crystals of silicon are created. However, with this technology, there is the possibility of impurities dissolving into the molten silicon solution from the nozzle. Furthermore, because there is a volume increase when molten silicon solution solidifies, and because solidification begins from the surface, the part which solidifies last will protrude towards the surface of the spherical crystal, and a protruding area is formed. A truly spherical sphere crystal is not formed. However, with the drop tube type experimental apparatus of NASA, because it is equipped with an electromagnetic levitation heating equipment, the material is allowed to melt and free fall.

In this USP, a pn junction is formed on the spherical crystal of silicon. There is also disclosed a solar cell array where there is formed a metal electrode film which is common to a plurality of these sphere crystals (micro photocells). Furthermore, these solar cell arrays are submerged in electrolyte solution. There is also disclosed a photochemical energy conversion device where electrolysis of a solution of hydroiodic acid and hydrobromic acid proceeds by the photovoltage provided by sunlight.

In the silicon solar cell array of this USP, there is not a pair of electrodes formed for each individual micro photocell, but there is a common electrode formed for a plurality of micro photocells. It is not possible to handle individual micro photocells independently. As a result, the micro photocells can not be dispersed in the electrolyte solution as individual semiconductor photocatalysts. Their installation positions can not be changed, nor can they be recovered and reused or washed. The limitations in its use as a semiconductor photocatalyst are extremely large. In addition, in this USP, there is no disclosure regarding the use of semiconductors with photocatalytic capability as electrodes, nor is there disclosure regarding the use of semiconductors which have photocatalytic function and which are selected by considering the reaction activity or reaction selectivity.

Because there is not a pair of electrodes on the surface of each of the microphotocells described above, a single or a plurality of spherical semiconductor elements having a pn junction can not be incorporated into a semiconductor device in such a way that they are independent cells or elements. Because the mode of electrical connection of the plurality of spherical semiconductor elements is fixed, it lacks in generalizability and is not practical.

In the prior art, a color display has been put into practical use. This color display incorporates a plurality of light emitting diodes which are of three types, emitting red light, blue light, or green light. Because each of the light emitting diode lamps can not have a detailed construction, it is not appropriate for small or light weight high resolution displays. In the case of a large size display, the number of parts is large, and it does not have an overall simple construction. The assembling cost is high. Using an integrated circuit technology, it is possible to produce light emitting diode elements which emit 3 colors of light, but the production costs become expensive. The interior integrated circuit becomes complicated, and defective products are more easily generated. This is not practical.

The object of the present invention is to provide the following: a semiconductor device with a spherical semiconductor element which is bead-like, has photovoltaic capability, and has a pair of electrodes; a semiconductor photocatalyst which has excellent photoelectric conversion efficiency and which is practical and generalizable; a semiconductor photocatalyst with an increased electric potential between the oxidizing and reducing electrodes; a semiconductor photocatalyst in which the electric potential between the oxidizing and reducing electrodes can be adjusted freely; a semiconductor device as a solar battery which can receive incident light over a broad range and which has a high utilization efficiency of the semiconductor material; a semiconductor device as a solar battery which has a high degree of freedom in its electrical connections and which has a thin thickness; various semiconductor devices or the like as photodiodes.

A further object of the present invention is to provide the following: a semiconductor device with a spherical semiconductor element which is bead-like, has light emitting capability through a pn junction, and has a pair of electrodes; a semiconductor device as a light emitting element which can emit light over a broad range and which has a high utilization efficiency of the semiconductor material; a semiconductor device as a light emitting element which has a high degree of freedom in its electrical connections and which has a thin thickness; semiconductor devices or the like as light emitting diodes, display panel, or various diodes.

DISCLOSURE OF THE INVENTION

The semiconductor device of the present invention comprises: spherical semiconductor elements which are granular and independent and comprising: a spherical crystal of p-type semiconductor or n-type semiconductor; a photovoltaic part which is incorporated onto the surface or onto an area near the surface of the spherical crystal and which generates photovoltage in association with the spherical crystal; at least one pair of electrodes which is on both sides of the photovoltaic part and is also on the surface of the spherical crystal and which is mutually separated (claim 1).

When light is shined on the spherical semiconductor element, the photovoltage which is generated in the photovoltaic part appears on the pair of electrodes. A potential difference is generated between the pair of electrodes. This semiconductor device can be constructed from a single or a plurality of spherical semiconductor elements. It can also have other compositional elements as well. When this semiconductor device is immersed in an electrolyte solution, current flows from the positive electrode to the negative electrode, passing through the electrolyte solution. As a result, there is an oxidizing action in which electrons are absorbed at the positive electrode, and there is generated a reducing action at the negative electrode where electrons are given up. There is an electrochemical reaction corresponding to the electrolyte solution. In the case where the semiconductor device is maintained in atmospheric conditions or in a vacuum, when light is shined on the spherical semiconductor element, a potential difference is generated between the electrodes. Light energy is converted to electrical energy. As a result, this can be used in solar batteries or photodiodes.

Because the spherical semiconductor element has a pair of electrodes and is constructed as independent particles, this is advantageous for lining up a plurality of spherical semiconductor elements and for connecting them electrically. When creating a semiconductor device by incorporating a single or a plurality of spherical semiconductor elements to other compositional elements, there is a high degree of freedom, and it has excellent generalizability. The strength of the generated voltage can also be chosen freely.

The electrode with one polarity and the electrode with the other polarity are placed so that they are at least partially opposite each other with the center of the spherical crystal interposed between them (claim 2 which is dependent on claim 1). When the electrodes are constructed in this way, a plurality of spherical semiconductor elements can be aligned in a single row and a serial electrical connection can be created simply by connecting electrodes with opposing polarities. The connection can be maintained by the photovoltage. For the serial connection, the serial connection can be made easily by applying an external electric field while shining a light.

The photovoltaic part comprises a diffusion layer which is formed near the surface of the spherical crystal and a pn junction (claim 3 which is dependent on claim 2). If the spherical crystal is a p-type semiconductor, there is a n-type diffusion layer, if the spherical crystal is a n-type semiconductor, there is a p-type diffusion layer. The photovoltage is generated via the pn junction which is at the border between the diffusion layer and the semiconductor crystal which forms the spherical crystal. As a result, the voltage is high and has excellent stability. It is advantageous in terms of the photoelectric conversion efficiency.

The photovoltaic part has an MIS configuration where an insulating coating is formed on a portion of the surface of the spherical crystal, and a metal coating, which serves as an electrode of one polarity, is formed on the surface of this insulating coating (claim 4 which is dependent on claim 2). MIS is an abbreviation for Metal Insulator Semiconductor. The MIS configuration is a known art. The configuration of the photovoltaic part is simplified, and this is advantageous in terms of manufacturing costs.

The photovoltaic part has a Schottky barrier configuration where a metal coating is formed on a portion of the surface of the spherical crystal, and this metal coating serves as an electrode of one polarity (claim 5 which is dependent on claim 2). The Schottky barrier construction is a known art. The construction of the photovoltaic part can be made extremely simple. This is advantageous in terms of the manufacturing costs.

The spherical semiconductor element is a semiconductor photocatalyst, which, with the photovoltage generated when the photovoltaic part receives light, generates an electrochemical reaction between the electrodes and the electrolyte solution. (claim 6 which is dependent on one of the claims of claims 3–5).

Examples of the electrochemical reaction include the electrolysis of water, electrolysis of methanol aqueous solution, electrolysis of hydriodic acid solution, or the electrolysis of various other electrolyte solutions. In this case, the semiconductor device can be constructed solely from a plurality of spherical semiconductor elements. Material with a catalytic function is preferred for the material of the electrode. Using reaction activity and reaction selectivity as a basis, material which is to be used for the electrode is selected on its relation with the reaction products. For example, for a hydrogen generating reducing electrode, Ni (nickel), Ru (ruthenium), Ir (iridium), or their oxides are preferred, but it is not limited to these. Appropriate material for a reducing electrode which generates methane is Pd (palladium), Rh (rhodium), but is not limited to these. When an electrode of one polarity is constructed with a metal oxide semiconductor which functions as a photocatalyst, the activating voltage for the electrochemical reaction can be low, and the energy conversion efficiency is increased.

The semiconductor device comprises a plurality of spherical semiconductor elements. The semiconductor device is operated while several spherical semiconductor elements at a time are connected electrically in series via the photovoltage generated by the photovoltaic part of the spherical semiconductor elements which are in the electrolyte solution (claim 7 which is dependent on claim 6). In this case, the semiconductor device does not require compositional elements other than a plurality of spherical semiconductor elements. The plurality of bead-like spherical semiconductor elements can be used as semiconductor photocatalysts. Depending on the type of electrochemical reaction, the spherical semiconductor elements can be used each independently, or n of these (n an integer of 2 or greater) can be connected in series, and a photovoltage of approximately n times can be generated. In this case, the plurality of spherical semiconductor elements can be dispersed in the electrolyte solution; the placement positions can be changed as appropriate; recovery and reuse is possible. As a result, there is a the degree of freedom in its usage, and there is excellent generalizability. Because the positive electrode and the negative electrode are separated, the reverse reaction is prevented. Because the spherical semiconductor can be illuminated from a light from broad range of incident angles, it is advantageous when using sunlight. Furthermore, spherical semiconductor elements have excellent mechanical strength.

The surface of the spherical crystal, other than at the electrodes, is covered with an insulating coating which is light transparent and has anti-reflective properties (claim 8 which is dependent on claim 6). This insulating coating can be a coating of one layer, or it can be a coating of 2 layers. Electrical and chemical stability is maintained by the insulating action of the insulating coating. The rate of reflection of light is lowered due to the anti-reflective function of the insulating coating, and the efficiency is improved. The following materials can be used as material for the insulating coating: $SiO_2$, $Si_3N_4$, $Al_2O_3$, $Ta_2O_5$, $TiO_2$, $MgF_2$, $SnO_2$, or $Nb_2O_5$, or the like. However, the material for the insulating coating is to be selected in relation with the spherical crystal material.

The surface of the insulating coating is covered with a light transparent coating which is connected to an electrode of one polarity; this coating is made of metal oxide semiconductor which has a photocatalytic capacity (claim 9 which is dependent on claim 8). The electrochemical reaction can be accelerated by the photocatalytic capacity of this coating. Metal oxide semiconductors which have a photocatalytic capacity include: $TiO_2$, $SrTiO_3$, $Fe_2O_3$, $PbxTi(1-x)O_2$, and the like. The energy band gap curves at the phase boundary surface where these metal oxide semiconductors are in contact with the electrolyte solution. The hole and the electrons separate, and the oxidation reaction or reduction reaction is accelerated.

The surface of an electrode of one polarity and a portion or the entire surface of the insulating coating is covered with a light transparent electrode coating; this coating is made of metal oxide semiconductor which has a photocatalytic capacity (claim 10 which is dependent on claim 8). This electrode coating can accelerate the electrochemical reaction by its photocatalytic capacity. Furthermore, the electric potential between the oxidizing and reducing electrodes can be increased.

The electrode of one polarity is constructed from a light-transparent electrode coating; this coating is formed on the surface of the diffusion layer and forms a hetero-junction with respect to the diffusion layer; this electrode coating is made of metal oxide semiconductor which has a photocatalytic capacity. (claim 11 which is dependent on claim 8). The barrier for the carrier is reduced by the hetero-junction. In addition, the photovoltaic effect of the pn junction, which is created by the diffusion layer which is formed near the surface of the spherical crystal, and the metal oxide semiconductor, which has a photovoltaic capacity, act in cooperation to increase the photocatalytic effect.

The spherical crystal described above is constructed from a semiconductor of Si or SiGe, Group III–V compound semiconductor of GaAs or InP or the like, chalcopyrite-type semiconductor of $CuInSe_2$ or the like (claim 12 which is dependent on one claim from claims 3–5).

The semiconductor device comprises: a transparent case which has a storage cavity which stores a single spherical semiconductor element; a pair of external electrodes which is partially inserted into both sides of the storage cavity and hermetically seals the cavity; the pair of external electrodes being electrically connected to electrodes of each of the spherical semiconductor elements (claim 13 which is dependent on one claim from claims 3–5). This semiconductor device is appropriate for photodiodes. When light is shined from outside of the case, a potential difference is generated in the pair of external electrodes. Because the spherical semiconductor element is housed inside a transparent case, it is possible to detect incident light from the entire 360 degree range.

The semiconductor device comprises: a semiconductor element array in which a plurality of the spherical semiconductor elements is electrically connected in series and is lined up in a single row; a transparent case which has a storage cavity which stores this semiconductor element array; a pair of external electrodes which is partially inserted onto both sides of the storage cavity of the case and hermetically seals it; the pair of electrodes being electrically connected to each of the electrodes of the spherical semiconductor elements which are on both ends of the semiconductor array (claim 14 which is dependent on one claim from claims 3–5). This semiconductor device is suitable for photodiode arrays or solar cell arrays. Because the semiconductor element array is housed inside a transparent case, it is possible to detect incident light from the entire 360 degree range. By adjusting the number of spherical semiconductor elements which are connected in series, the size of photovoltage can be adjusted appropriately.

In the casing described above, a plurality of storage cavities can be formed in parallel; a semiconductor element array is placed in each storage cavity; a pair of external electrodes is placed on either end of each storage cavity (claim 15 which is dependent on claim 14). The overall semiconductor device is panel-like or sheet-like. It receives incident light from either side of the transparent case and converts it to voltage. The multi-row multi-column spherical semiconductor elements can reliably receive incident light even when there are large changes in the angle of incidence of the light. It is suited for solar battery panels. Furthermore, because a portion of the incident light exits from the opposite side by passing through the spherical semiconductor elements and the case, it can be a solar battery panel which also serves as window glass.

The semiconductor device comprises: a semiconductor element array in which a plurality of the spherical semiconductor elements is electrically connected in series and is lined up in a single row; a pair of electrodes being electrically connected to each of the electrodes of the spherical semiconductor elements which are on both ends of the semiconductor array; a transparent case member which covers the exterior of the semiconductor element array (claim 16 which is dependent on one of the claims of claims 3–5). The case member is preferably constructed from a synthetic resin material of silicone resin or the like. The semiconductor element array can be imbedded inside the case member. All other aspects are the same as the semiconductor device in claim 13.

A plurality of the semiconductor element array can be placed in parallel; the plurality of semiconductor element arrays are stored in an imbedded state inside the case member; a plurality of pairs of electrodes are placed corresponding to the plurality of semiconductor element arrays (claim 17 which is dependent on claim 16). The case member is preferably constructed from a synthetic resin material of silicone resin or the like. Because the semiconductor element arrays are imbedded inside the case member, the incidence efficiency of the light is heightened. Other aspects are the same as in the semiconductor device of claim 15.

A semiconductor device comprises: spherical semiconductor elements which are independent and bead-like, comprising: a spherical crystal of p type semiconductor or n-type semiconductor; a diffusion layer and a pn junction formed near the surface of the spherical crystal; at least one pair of electrodes which is on both sides of the pn junction and is also on the surface of the spherical crystal and which is mutually separated (claim 18). When voltage is applied to the pair of electrodes of the spherical semiconductor element, the semiconductor device emits light at the pn junction as a function of the type of semiconductor spherical crystal and the type of dopants contained in the semiconductor. This principle of the light emission is the same as the principle for known light emitting diodes. The configuration of the light emitting mechanism is the same as in known light emitting diodes.

As a result, this semiconductor device is suited as a light emitting element. However, it can also be used for various diodes or the like such as other rectifier diodes or the like. The type of semiconductor, the type of doping agent elements, the type of pn junction (in other words, the configuration of the spherical semiconductor element) can be set for the desired light emitting function or other function. The settings are based on known technology relating to light emitting diodes. The semiconductor device can be constructed from a single or a plurality of spherical semiconductor elements, and can also include other configuration elements. When using as a light emitting element, because light is emitted in the interior of the spherical semiconductor element, there are no limitations on the direction in which the light exits, and light can exit in all directions. The spherical semiconductor element has a pair of electrodes and is constructed as independent particles. As a result, this is advantageous for connecting resistance wires individually to each spherical semiconductor element. When making a semiconductor device which incorporates a single or a plurality of spherical semiconductor elements to other configuration elements, there is a high degree of freedom and excellent generalizability. The light emitting capability can also be set freely.

The surface of the spherical crystal, other than at the electrodes, is covered with an insulating coating which is light transparent (claim 19 which is dependent on claim 18). The insulating coating can be a single layer coating, or a 2 layer coating. Electrical and chemical stability can be maintained by the insulating action of the insulating layer. The electrode with one polarity and the electrode with the other polarity are placed so that they are at least partially opposite each other with the center of the spherical crystal interposed between them (claim 20 which is dependent on claim 19). When the electrodes are constructed in this way, a plurality of spherical semiconductor elements can be lined up in a single row. They can be electrically connected in a serial manner simply by having electrodes of different polarities in contact with each other.

A semiconductor device comprises: a transparent case which has a storage cavity which stores one spherical semiconductor element; a pair of external electrodes which is partially inserted onto both ends of the storage cavity and which hermetically seals it; the pair of external electrodes being connected electrically to the electrodes of each of the spherical semiconductor elements (claim 21 which is dependent on claim 20). This semiconductor device is suited for rectifier diodes and variable capacity diodes or the like. Voltage can be applied to the pair of electrodes of the spherical semiconductor element via the pair of external electrodes.

A semiconductor device comprises: a semiconductor element array in which a plurality of the spherical semiconductor elements is electrically connected in series and is lined up in a single row; a transparent case which has a storage cavity which stores this semiconductor element array; a pair of external electrodes which is partially inserted onto both sides of the storage cavity of the case and hermetically seals it; the pair of electrodes being electrically connected to each of the electrodes of the spherical semiconductor elements which are on both ends of the semiconductor array (claim 22 which is dependent on claim 20). When voltage is applied to the pair of external electrodes, a plurality of spherical semiconductor elements of the semiconductor element array emit light Therefore, this semiconductor device is suitable for light emitting diode arrays. Because the semiconductor element array is housed inside a transparent case, light can exit from the entire 360 degree range. By adjusting the number of spherical semiconductor elements which are connected in series, the light emitting capacity can be adjusted appropriately.

In the casing described above, a plurality of storage cavities can be formed in parallel; a semiconductor element array is placed in each storage cavity; a pair of external electrodes is placed on either end of each storage cavity (claim 23 which is dependent on claim 22). The overall semiconductor device is panel-like or sheet-like. Although light exits from either side of the transparent case, light can be made to exit from only one side by forming a reflective coating on the other side. When light is emitted from a plurality of rows and a plurality of columns of the spherical semiconductor elements, it becomes a light emitting surface. It is suited for a light emitting surface device.

A semiconductor device comprises: a semiconductor element array in which a plurality of the spherical semiconductor elements is electrically connected in series and is lined up in a single row; a pair of electrodes which is electrically connected to each of the electrodes of the spherical semiconductor elements which are on both ends of the semiconductor array; a transparent case member which covers the exterior of the semiconductor element array (claim 24 which is a dependent of claim 20). The case member is preferably constructed from a synthetic resin material of silicone resin or the like. The semiconductor element array can be imbedded inside the case member. Other aspects are the same as in the semiconductor device of claim 22.

There are a plurality of rows of semiconductor element arrays; this plurality of semiconductor element arrays are embedded in the transparent sheet-like case member described above; there are a plurality of pairs of electrodes which correspond to the plurality of semiconductor element arrays (claim 25 which is dependent on claim 24). The case member is preferably constructed from a synthetic resin material of silicone resin or the like. Because the semiconductor element array is imbedded inside the case member, the light exiting efficiency is heightened. Other aspects are the same as in the semiconductor device of claim 23.

The present semiconductor device is a device which has a light emitting function in which light is emitted by applying voltage to the spherical semiconductor elements (claim 26 which is dependent upon one of the claims of claims 21–25).

The semiconductor device is a device which functions as a light emitting display panel, wherein: a plurality of the spherical semiconductor elements are placed to make a matrix of a plurality of rows and a plurality of columns; these plurality of spherical semiconductor elements are housed in a case member which is transparent and panel-like; light is emitted by selectively applying voltage to the pair of electrodes of each individual semiconductor elements. (claim 27 which is dependent upon claim 18). The overall semiconductor device is panel-like. Although light exits from both sides of the transparent case, light can be made to exit from only one side by forming a reflective coating on the other side. In the case of a large size display panel, the diameter of the spherical semiconductor element can be of a size of several mm, but in the case of a small size display panel on the order of a CRT display or a liquid crystal display, the diameter of the spherical semiconductor element is on the order of 200–300 micrometer. Furthermore, in order to prevent the light leaving each spherical semiconductor element from leaking towards neighboring spherical semiconductor elements, it is preferable to form a fine separating wall which optically isolates the spherical semiconductor elements.

In the case of a monochromatic display panel, one type of spherical semiconductor element is used. In the case of a color display panel, it is necessary to generate full color light by the synthesis of the three colors of red, green, and blue light. As a result, the plurality of spherical semiconductor elements comprises: a plurality of spherical semiconductor elements number 1 which is capable of generating red light; a plurality of spherical semiconductor elements number 2 which is capable of generating green light; a plurality of spherical semiconductor elements number 3 which is capable of generating blue light. Spherical semiconductor elements numbers 1–3 are alternated cyclically in the row direction of the matrix, and are alternated cyclically in the column direction of the matrix (claim 28 which is dependent upon claim 27).

Each spherical crystal in the spherical semiconductor elements numbers 1–3 are n-type GaAs semiconductors. The diffusion layer on the spherical crystal contains Zn as the p-type dopant (claim 29 which is dependent upon claim 28). On the surface of the spherical crystal of the spherical semiconductor element number 1, there is formed a coating which contains a phosphor which converts infrared light to red light; on the surface of the spherical crystal of the spherical semiconductor element number 2, there is formed a coating which contains a phosphor which converts infrared light to green light; on the surface of the spherical crystal of the spherical semiconductor element number 3, there is formed a coating which contains a phosphor which converts infrared light to blue light (claim 30 which is dependent upon claim 29) In this manner, except for the coating which contains the phosphor, spherical semiconductor elements numbers 1–3 can be constructed with the same configuration, and they can be driven by the same driving voltage.

BRIEF DESCRIPTION OF THE DRAWINGS

FIGS. 1–17 show the first embodiment of the present invention.

FIG. 1 is a cross-sectional diagram of a spherical crystal of a semiconductor.

FIG. 2 is a cross-sectional diagram of the spherical crystal covered with a coating.

FIG. 3 is a cross-sectional diagram in which the spherical crystal is covered with a coating and masked with a resin film.

FIG. 4 is a cross-sectional diagram in which etching has been done after masking.

FIG. 5 is a cross-sectional diagram in which a p-type diffusion layer is formed on the spherical crystal.

FIG. 6 is a cross-sectional diagram in which there is a coating formed on the surface of the spherical crystal.

FIG. 7 is a cross-sectional diagram in which there is a light sensitive resin film mask, and an opening is formed.

FIG. 8 is a cross-sectional diagram of a semiconductor photocatalyst.

FIG. 9 is a block diagram of a semiconductor spherical crystal manufacturing device.

FIG. 10(*a*) is a temperature distribution diagram of a molten solution immediately after melting.

FIG. 10(*b*) is a temperature distribution diagram of the molten solution immediately after the commencement of dropping.

FIG. 10(*c*) is a temperature distribution diagram of the molten solution immediately after heating with an infrared heater.

FIG. 10(*d*) is a temperature distribution diagram of the molten solution immediately after solidification has begun.

FIG. 11 is a cross-sectional diagram of a modification mode 1 of the semiconductor photocatalyst.

FIG. 12 is a cross-sectional diagram of a modification mode 2 of the semiconductor photocatalyst.

FIG. 13 is a cross-sectional diagram of a modification mode 3 of the semiconductor photocatalyst.

FIG. 14 is a cross-sectional diagram of a modification mode 4 of the semiconductor photocatalyst.

FIG. 15 is a cross-sectional diagram of an electrolytic device with a semiconductor photocatalyst.

FIG. 16 is a schematic cross-sectional diagram of an electrolytic device with a semiconductor photocatalyst which has been partially modified.

FIG. 17 is a schematic cross-sectional diagram of an electrolytic device with a semiconductor photocatalyst which has been partially modified.

FIGS. 18–28 are diagrams of Embodiment 2 of the present invention.

FIG. 18 is a cross-sectional diagram of a solar cell.

FIG. 19 is a cross-sectional diagram of a rectifier diode of a modification mode 1.

FIG. 20 is a cross-sectional diagram of a photodiode of a modification mode 2.

FIG. 21 is a cross-sectional diagram of a solar battery device of a modification mode 3.

FIG. 22 is a plan view of the solar battery device of FIG. 21.

FIG. 23 is a cross-sectional diagram of another solar battery device.

FIG. 24 is a cross-sectional diagram of a solar battery module of modification mode 3.

FIG. 25 is a plan view of the solar battery module of FIG. 24.

FIG. 26 is a cross-sectional diagram of another solar battery module.

FIG. 27 is a plan view of the solar battery module in FIG. 26.

FIG. 28 is a cross-sectional diagram of the electrolytic device which uses a solar battery module.

FIG. 29 is a block diagram of a display panel which incorporates light emitting diodes of 3 colors.

FIG. 30 is a schematic drawing of an electrical circuit of a display panel.

FIG. 31 is a cross-sectional diagram of a spherical crystal of a semiconductor.

FIG. 32 is a cross-sectional diagram of the spherical crystal which forms a pn junction with a p-type diffusion layer.

FIG. 33 is a cross-sectional diagram of a spherical crystal which has electrodes.

FIG. 34 is a cross-sectional diagram of a light-emitting diode.

FIG. 35 is a cross-sectional drawing of FIG. 29 along the line IIIXV–IIIXV.

BEST MODE FOR CARRYING OUT THE INVENTION

Figure 9:
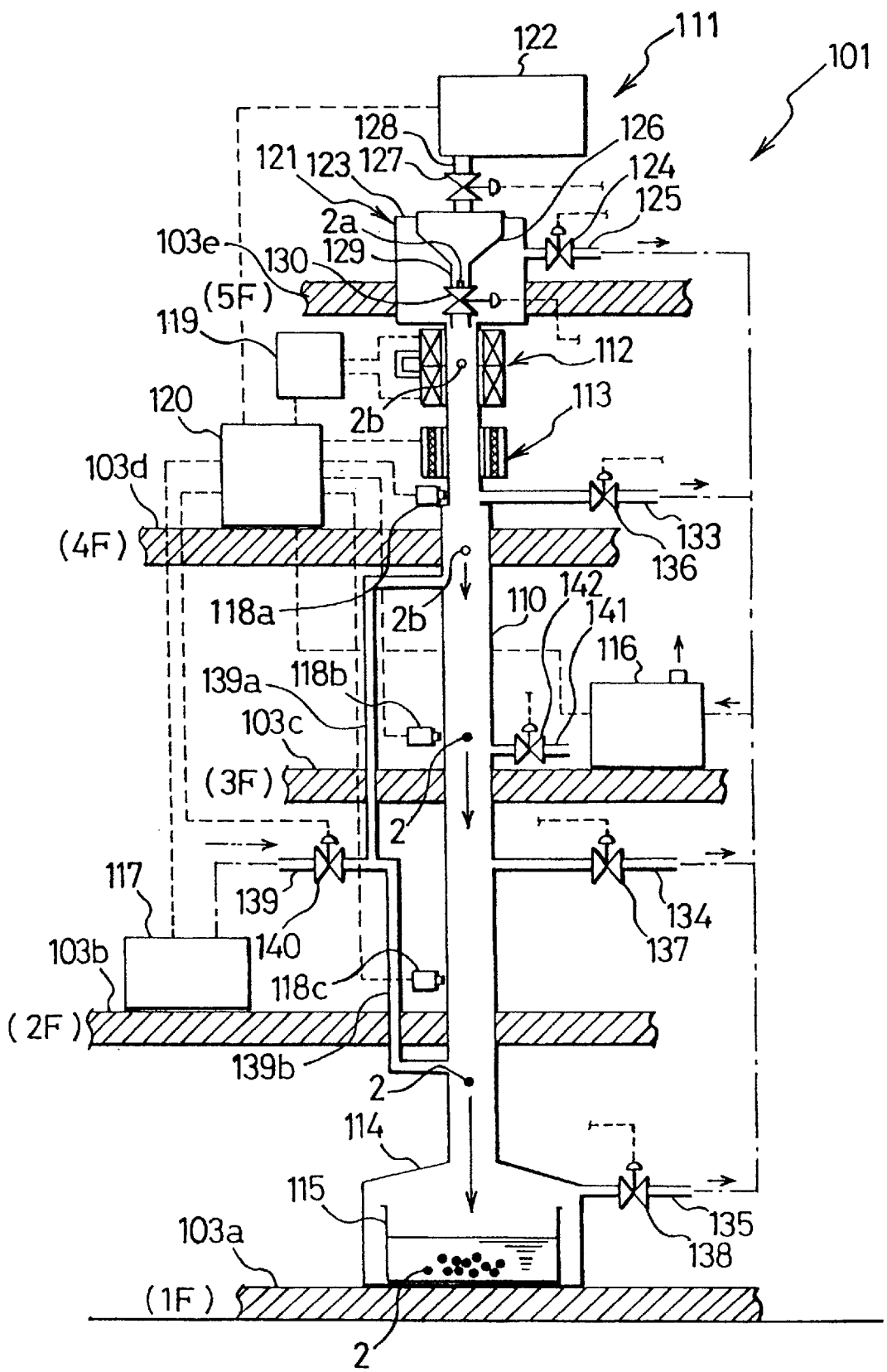

Referring to the drawings, the best mode for carrying out the present invention will be described below.

Embodiment 1 (Refer to FIGS. 1–17)

The semiconductor device of the present embodiment is constructed from an assemblage in which a plurality of units of semiconductor photocatalysts which are described below are assembled.

First, the configuration of the semiconductor photocatalyst will be described briefly.

Referring to FIG. 8, a semiconductor photocatalyst 1 (corresponding to spherical semiconductor element) comprises: a spherical crystal 2 of a n-type silicon semiconductor; a p-type diffusion layer 6 which is formed on the surface portion of the upper half of spherical crystal 2 and which is contained in spherical crystal 2; a pair of electrodes 14, 15; a coating 9 of SiO2 (silicon oxide) which covers the surface of spherical crystal 2, except at the electrodes 14, 15; a coating 10 of TiO2 (titanium oxide) which is formed on the surface of coating 9 of SiO2. A photovoltaic part 16 which contains a pn junction 7 is formed on the surface of spherical crystal 2. A micro photocell 17 is constructed from spherical crystal 2 and photovoltaic part 16. While immersed in an electrolyte solution, the independent and bead-like semiconductor photocatalyst 1 triggers an electrochemical reaction via the photovoltage generated by micro photocell 17 with light which is supplied from the exterior.

Next, the configuration and manufacturing method of semiconductor photocatalyst 1 is explained.

Figure 10:
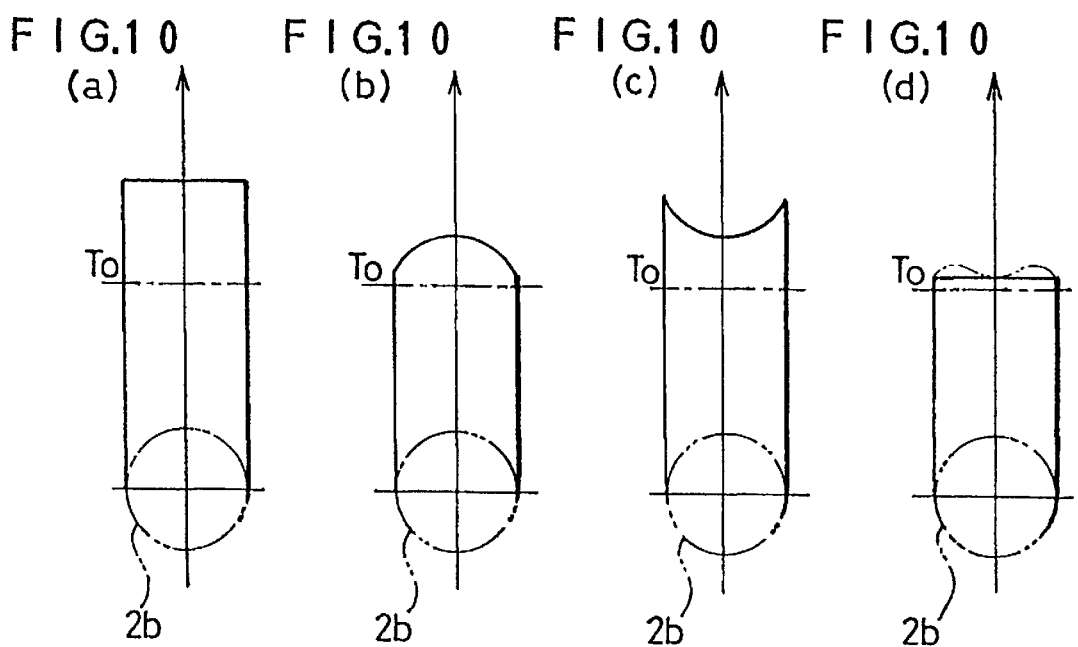

Referring to FIG. 1, step 1 is to produce spherical crystal 2 which is a spherical n-type silicon semiconductor. Spherical crystal 2 is formed into a perfect sphere using an n-type silicon semiconductor with a dopant concentration of approximately $1.5 \times 10^{16}$ cm$^{-3}$ and with a diameter of, for example, approximately 1.5 mm. Spherical crystal 2 which is a perfect sphere can be manufactured by melting silicon semiconductor granules with an electromagnetic levitation heating equipment. Next, the suspension is terminated, and the silicon semiconductor is solidified while it is free falling inside a drop tube. By doing this, spherical crystal 2 with a smooth surface can be produced. Furthermore, the crystal structure can be improved as needed by heating to a temperature of 600–900 degrees C. under an inert gas atmosphere and annealing. Referring to FIGS. 9, 10, step 1 of the manufacturing method of spherical crystal 2 will be described later.

Next, referring to FIG. 2, in step 2, spherical crystal 2 is heated to approximately 1150 degrees C. in an atmosphere which contains oxygen using a known method. A coating 3 of SiO2 (silicon oxide) of thickness 1 micrometer is formed over the entire surface of spherical crystal 2. Next, referring to FIG. 3, in step 3, spherical crystal 2, on which there is formed coating 3, is placed on a support plate 4 which is made of glass, for example. A liquid-state resin film 5 which is an acid resistant synthetic resin and has a thickness of approximately the radius of spherical crystal 2 is formed on top of support plate 4. After covering the bottom half of spherical crystal 2 with resin film 5, resin film 5 is made solid.

Next, in step 4, using a diluted hydrofluoric acid solution, portions of spherical crystal 2 which are not covered by resin film 5 are etched. Coating 3 of SiO2 is dissolved and removed. Referring to FIG. 4, the result is shown. Next, referring to FIG. 5, in step 5, resin film 5 is dissolved using a solvent. Spherical crystal 2 is removed from support plate 4. The surface of spherical crystal 2 is rinsed with an appropriate cleaning solution. Next, doping element for the formation of a p type diffusion layer 6 is diffused by heating on the surface of the upper half of spherical crystal 2 by a known method, and a p-type diffusion layer 6 is formed.

In this case, coating 3 covers the surface of the lower half of spherical crystal 2 and is used as a diffusion mask. P-type diffusion layer 6 is formed by heat diffusing B (boron) as a doping agent element. By the previously described heat diffusion, a coating 8 of SiO2 which is continuous with coating 3 is formed attached to the surface of p-type diffusion layer 6. As a result, a pn junction 7 between spherical crystal 2 and p-type diffusion layer 6 is formed at a depth of 0.5–0.8 micrometer from the surface of spherical crystal 2. When light from sunlight or the like is received from the exterior, pn junction 7 generates photovoltage by separating an excited carrier (electron and hole).

Next, in step 6, by etching with a diluted hydrofluoric acid solution, coating 3, 8 on the surface of spherical crystal 2 are removed. Next, referring to FIG. 6, a coating 9 of SiO2 is formed on the surface of spherical crystal 2 which contains diffusion layer 6. This is done by the known art of physical vapor deposition (PVD) or chemical vapor deposition (CVD). Coating 9 is formed in order to make the surface of pn junction 7 passivate. A TiO2 (titanium oxide) coating 10 is formed on the surface of coating 9.

Coatings 9, 10 reduce the leak current on the surface of pn junction 7. Coatings 9, 10 improve the stability. They also reduce light reflection at the surface because of their differences in the index of refraction. Both coatings 9, 10 serve as both insulating films and passivation films. They protect pn junction 7 and make the surface passivate. They also function as anti-reflective films which prevent the reflection of light. TiO2 is a n-type semiconductor and functions as a photocatalyst. As a result, light from the incident light which is of wavelength of approximately 420 nm or lower is absorbed by TiO2 coating 10. Light with longer wavelengths pass through SiO2 coating 9 and TiO2 coating 10 are absorbed by spherical crystal 2.

The thickness' of both coatings 9, 10 are determined by considering the following: their function as an passivation film for pn junction 7; the function of coating 10 as a photocatalyst; the degree of transmittance with respect to the received spectrum; or the like. In the case of silicon semiconductor spherical crystal 2, the thickness of SiO2 coating 9 is approximately 0.3–0.7 micrometer, and the thickness of TiO2 coating 10 is approximately 0.3–1.0 micrometer.

Next, referring to FIG. 7, in step 7, ohmic contacts (electrodes 14, 15) are formed at the lower end of spherical crystal 2 and at the top of p-type diffusion layer 6. These ohmic contacts are formed in a way that they are opposite each other, with the center of spherical crystal 2 interposed between them. First, a pair of openings 11, 12 with diameters of approximately 0.5 mm are formed on the transparent two layers of coatings 9, 10. This is accomplished by known methods of photolithography or plasma etching or the like. In this case, the pair of openings 11, 12 are formed while masking with a corrosion-resistant photoresist 13.

Next, in step 8, from the pair of openings 11, 12 in FIG. 7, Ti (titanium) is vapor deposited onto spherical crystal 2 using known vapor deposition methods. Next, Ni (nickel) is vapor deposited. A pair of ohmic contacts of thickness 0.1–1.0 micrometers are formed. Afterwards, they are sintered at 200–300 degrees C. in a vacuum. Corrosion-resistant, photoresist 13 is ashed and removed. In this manner, a positive electrode 14 is formed at the top of p-type diffusion layer 6 of spherical crystal 2, and a negative electrode 15 is formed at the bottom of spherical crystal 2. Electrodes 14, 15 become the entrance and exit for the inflow and outflow of current with respect to the outside circuit. Independent and bead-like semiconductor catalyst 1 as shown in FIG. 8 is obtained in this manner. An example of the manufacture of a single semiconductor photocatalyst was described above, but in practice, several semiconductor photocatalysts are manufactured at once.

As described later, an assemblage of several semiconductor catalysts 1 are immersed in a pre-selected electrolyte solution, and it can be used to trigger electrochemical reactions by shining light from outside. Materials which have a catalytic function are the preferred material for electrodes 14, 15. The selection of material depends on what is to be generated with the dissociation reaction. Reaction activity and reaction selectivity are used as a basis for selection. For example, in the electrolysis of water, Ru, Ir, as well as the previously described Ni, or their oxides are preferred for the hydrogen generating reducing electrode. When CO2 gas is photoreduced by water, Pd, Rh or the like is the preferred material for the CH4-gas producing reducing electrode.

Next, the operation of semiconductor photocatalyst 1 is explained.

As an example, the following situation will be described: semiconductor catalyst 1 is immersed in an electrolyte solution; light is shined from the outside; and there is electrolysis of the electrolyte solution. When a light such as sunlight which has a wide spectrum distribution is shined on semiconductor catalyst 1, a photovoltage, in which positive electrode 14 becomes positive and negative electrode 15 becomes negative, is generated. This happens as a result of light which has been transmitted through coatings 9, 10 and which is absorbed pn junction 7 and its rear region.

The maximum open circuit voltage which is generated between electrodes 14, 15 is 0.6V. When there is incident light on the surface of TiO2 coating 10 which is a n-type semiconductor, light with a wavelength below approximately 420 nm is absorbed by coating 10. By its photocatalytic action, a plurality of electrons and holes are generated. The energy band gap curves at the surface of TiO2 coating 10 where it is in contact with the phase boundary of the electrolyte solution or the like. A potential barrier similar to a Schottky barrier is created. As a result, the generated holes move to positive electrode 14. At the interface, holes capture electrons and disappear after losing an amount of energy which is close to the energy band obtained by the photo-excitation. This signifies the generation of oxidation action wherein electrons are captured at the surface of TiO2 coating 10. Simultaneously, at positive electrode 14, there is an oxidation action where electrons at the interface are captured by the photovoltage provided by pn junction 7 of silicon. TiO2 coating 10 is electrically in contact with positive electrode 14. As a result, compared with TiO2 alone, the photovoltage provided by pn junction 7 is applied as a bias. The oxidation potential is heightened, and the capturing of higher energy electrons becomes possible. Negative electrode 15 exhibits its reducing action, where electrons are given up to the exterior at the phase boundary of the electrolyte solution or the like. In this manner, semiconductor photocatalyst 1 exhibits its capacity as a photocatalyst which automatically triggers an electrochemical reaction with only the input of light.

Semiconductor photocatalyst 1 which is described above has the following effects.

(a) a micro photocell 17 is constructed by forming on spherical crystal 2, a photovoltaic part 16 which works together with spherical crystal 2 to generate photovoltage. There is formed TiO2 coating 10 which has a photocatalytic function and which is electrically connected to positive electrode 14. As a result, the activation voltage is lowered at electrodes 14, 15. A semiconductor photocatalyst with high energy conversion efficiency is obtained.

(b) By appropriately combining the energy band gap of pn junction 7 of silicon semiconductor spherical crystal 2 and the energy band gap of the metal oxide semiconductor which has photocatalytic function, such as TiO2, or the like, the potential difference between the electrodes can be made to be a suitable potential difference for the electrochemical reaction. The selectivity for the necessary reaction products can be increased.

(c) The surface of spherical crystal 2 is electrochemically protected with a thin oxide film such as TiO2 which is photochemically stable and which has a large energy band gap. The thin oxide film also exhibits functions as a photocatalyst and as an anti-reflective film. As a result, manufacturing costs are lowered. A semiconductor photocatalyst 1 which has a high energy conversion efficiency and high reliability can be realized.

(d) Semiconductor photocatalyst 1 is formed as a comparatively small sphere. A sphere has excellent mechanical strength and is difficult to destroy. Because it can freely move in a liquid, they can be dispersed in necessary places. Furthermore, positive electrode 14 and negative electrode 15 are opposite each other with the center of spherical crystal 2 interposed between them. As a result, while light is being shined, it is possible to electrically connect a plurality of semiconductor photocatalysts 1 in a series by applying an electric field from the outside.

(e) Because semiconductor photocatalyst 1 receives light from the sphere surface, the influence of the angle of incidence of the light is small. There is a high sensitivity to light with a wide incidence directions such as scattering light.

(f) In step 1 of the manufacturing of spherical crystal 2, it is molten in a levitated state. The surface tension of the melt is used to create the sphere and to have it solidify. As a result, there is no mechanical stress and lattice defects remaining in spherical crystal 2. There are no problems of impurity contamination which get mixed in from the container which stores the molten liquid, and a high quality substance is obtained. When a sphere crystal is made by letting the molten solution solidify while it free falls inside a drop tube, the quality is particularly good, with a good sphericity, uniform distribution of the constitution, and few crystal defects.

Next, the spherical crystal manufacturing device which creates silicon semiconductor spherical crystal 2 of step 1 is described. The method of manufacturing spherical semiconductor crystals is also described.

Referring to FIG. 9, a spherical crystal manufacturing device 101 comprises: a vertical drop tube 110 which has a diameter of 5–10 cm and a height of approximately 14m; an electromagnetic levitation heating equipment 112 which is placed on the outside of the upper part of drop tube 110; an infrared heater 113 which is an after heater; a material supply device 111 which supplies solid material 2a one at a time; a silicon oil chamber 115 which is housed in a housing area 114 which is continuous with the lower end of drop tube 110; a vacuum pump 116 which suctions air from inside drop tube 110; a gas supply device 117; a pipe system and valves; high speed cameras 118a–118c; a control unit 120 which controls these apparatus. Furthermore, floors 1–5 of the factory are depicted as floors 103a–103e.

Material supply device 111 comprises: a supplier 121; a parts feeder 122 which stores several granular solid material 2a and which supplies them one at a time. Parts feeder 122 has a function of pre-heating solid material 2a and a function for evacuation of atmosphere. A case 123 of a supplier 121 is connected to vacuum pump 116 by a suction pipe 125 which has an electromagnetic switch valve 124. A receiving apparatus 126 is connected to parts feeder 122 by a pathway 128 which has an electromagnetic shutter 127. There is an electromagnetic shutter 130 at an exit pathway 129 of receiving apparatus 126. Vacuum from inside case 123 is introduced via a plurality of small holes to receiving apparatus 126. During the operation of manufacturing device 101, electromagnetic valve 124 is opened, and there is a vacuum inside supplier 121. When supplying solid material 2a from parts feeder 122, electromagnetic shutter 130 is closed. Electromagnetic shutter 127 is opened, and after solid material 2a is supplied to the inside of receiving apparatus 126, electromagnetic shutter 127 is closed. There are electromagnetic valves 136–138 on suction pipes 133–135 which are connected to vacuum pump 116. In order to allow inert gases or oxidizing gases to flow inside drop tube 110 as needed, there are a gas supply device 117, a gas supply pipe 139, branching pipes 139a, 139b, a gas discharge pipe 141, and electromagnetic valves 140, 142. However, if a vacuum is to be maintained inside drop tube 110, gas supply device 117 is stopped, and electromagnetic valves 140, 142 are closed.

Electromagnetic levitation heating equipment 112 is constructed from an upper coil, a lower coil, and a high frequency current generating device 119, and the like. An upward force of magnetic line is generated by the upper coil. A downward magnetic line of force is generated by the lower coil. An induced current is generated in solid material 2a by the magnetic lines of force which change at a high frequency. When solid material 2a is at a central position between the upper and lower coils, the force of the magnetic line of force acting on the induced current are balanced between the upward force and downward force. Solid material 2a is maintained in a levitated state. Solid material 2a is heated by the heat generating action of the induced current. When solid material 2a becomes molten liquid material 2b, the high frequency current is shut down. Molten liquid material 2b begins a free-fall. With this free-fall, molten liquid material 2b becomes spherical by the action of surface tension under a very small gravitational force of $10^{-5}$.

The purpose of infrared heater 113 is for heating only the surface of molten liquid material 2b by a small amount. Infrared heater 113 is placed as a ring around the outside of drop tube 110. Infrared heater 113 is placed at a certain distance away from electromagnetic levitation heating equipment 112. Infrared heater 113 comprises a cylindrical heater body which is made of an infrared radiation ceramics. By controlling the current which is supplied to this heater body, the heating function can be controlled precisely. Because molten liquid material 2b rotates while free falling, only the surface of molten liquid material 2b is heated evenly by infrared heater 113.

Next, the operations will be described where manufacturing device 101 is used to make spherical crystal 2 from n-type silicon solid material 2a. In the first preparation stage, electromagnetic valves 123, 136, 137, 138 are opened. Vacuum pump 116 is operated, and specified vacuum conditions are created inside drop tube 110. A single solid material 2a is stored in receiving apparatus 126. There is a pre-determined current flowing through infrared heater 113. Next, current is run through electromagnetic levitation heating equipment 112. Electromagnetic shutter 130 is opened, and solid material 2a free-falls. While in a levitated state, solid material 2a is heated by electromagnetic levitation heating equipment 112 for a specified short amount of time. Solid material 2a becomes molten liquid material 2b. Referring to FIG. 10(a), the temperature distribution of molten liquid material 2b at this time is such that the temperature is roughly the same in both the interior and on the surface of molten liquid material 2b.

Next, the current to electromagnetic levitation heating equipment 112 is shut off. Molten liquid material 2b begins a free fall in the vacuum of drop tube 110. Because liquid molten material 2b is under microgravity conditions, after the commencement of the free-fall, molten liquid material 2b becomes spherical by the action of surface tension. Molten liquid material 2b initially falls with a low speed. In the short time it takes to fall to the level of the upper end of infrared heater 113, there is radiative cooling, and there is heat release. Because there is heat release from the surface of molten liquid material 2b, the surface of molten liquid material 2b is cooler than the interior (refer to temperature distribution in FIG. 10(b)).

Next, during the free fall of the molten liquid material 2b through the interior of infrared heater 113, only the surface is heated. Referring to FIG. 10(c), the surface of liquid molten material 2b is warmer than the interior. Next, while it is free falling towards the bottom of infrared heater 113, molten liquid material 2b releases heat through radiative cooling. By the action of surface tension, molten liquid material 2b solidifies to a truly spherical crystal 2.

After passing through infrared heater 113, radiative cooling progresses. Referring to FIG. 10(d), the temperature distribution of molten liquid material 2b when the temperature has dropped to near the solidifying point T0 is indicated by the solid line or the dotted line. Because solidification begins with these conditions, solidification begins from the interior and from the surface of molten liquid material 2b. As a result, even if there is volume expansion during solidification, there are no projections formed on the surface of spherical crystal 2. The inner mechanical stress of spherical crystal 2 also becomes very small. Afterwards, spherical crystal 2, which has finished solidification at around the middle level of drop tube 110, drops into silicon oil inside silicon oil chamber 115. They are stored there and are cooled completely. Even though the interior distortions is reduced in spherical crystal 2 described above, if the overall spherical crystal 2 does not become a monocrystal, afterwards, spherical crystal 2 can be made into a monocrystal through anneal processing.

Spherical crystal 2 which is truly spherical and which is without any projections can be manufactured in the above manner. Even if there are projections which have formed, they are extremely small projections which can be eliminated during the annealing process. Furthermore, because the surface of molten liquid material 2b does not solidify before the inside does, any bubbles on the surface of solid material 2a does not mix in spherical crystal 2. Because molten liquid material 2b solidifies to spherical crystal 2 under microgravity conditions, a spherical crystal 2 with a n uniform constitutional distribution with no influence from heat convection, buoyancy, sedimentation is achieved.

Modification mode 1 . . . (refer to FIG. 11)

Figure 11:
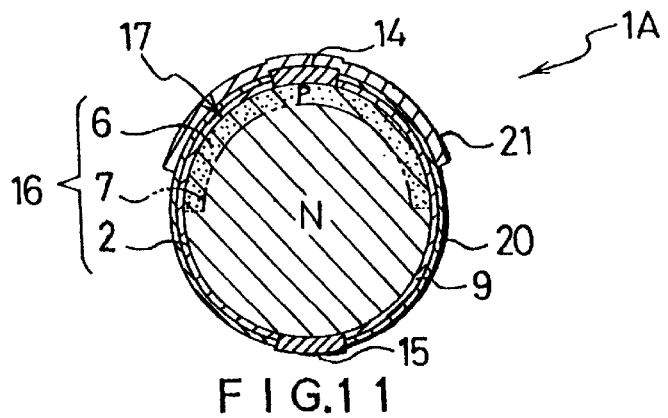

Next, semiconductor photocatalyst 1A which is a partial modification of semiconductor photocatalyst 1 will be described. However, the description of elements which have the same numerals as those which have been described previously are abbreviated . Referring to FIG. 11, in this semiconductor photocatalyst 1A, instead of TiO2 coating 10, there is a Si3N4 (silicon nitride) coating 20 (thickness approximately 0.3–0.7 micrometer) which is formed by PVD or CVD method. Furthermore, a TiO2 electrode coating 21 (thickness approximately 1.0 micrometer) is formed by PVD or CVD method. Electrode coating 21 covers a large proportion of the surface of the upper half of spherical crystal 2, including the surface of positive electrode 14. Because positive electrode 14 is masked by TiO2 electrode coating 21, a direct exchange of electrons with the outer interface is not possible. Instead, electrode coating 21 functions as a positive electrode which has an oxidative action.

As described previously, because the energy band is bent at the surface of TiO2 electrode coating 21, a plurality of electron and hole pairs are generated when light is received. Holes accumulate at the phase boundary. This becomes a positive electric potential compared with negative electrode 15, and it acts in a way to run current to the outside. When this current flows, an oxidation reaction is generated at the surface of electrode coating 21 which has a photocatalytic function. A reduction action is generated at negative electrode 15. When semiconductor photocatalyst 1A receives sunlight, TiO2 electrode coating 21 absorbs light at wavelengths shorter than approximately 410 nm. Light with longer wavelengths are absorbed by micro photocell 17.

The photovoltage generated at pn junction 7 is a bias with respect to electrode coating 21 and heightens the surface electric potential of electrode coating 21. As a result, the oxidation voltage at electrode coating 21 is heightened, and the electrical energy which is available for electrochemical reactions is heightened. TiO2 has a larger energy band gap than the silicon semiconductor of spherical crystal 2, and it also absorbs short wavelength light to photo-excite electrons and holes. Because electrode coating 21 is formed from TiO2, light such as sunlight, which has a wide spectral distribution, can be efficiently converted to chemical energy. Furthermore, the electric potential between the oxidation and reducing electrodes can be made large.

Modification mode 2 . . . (refer to FIG. 12)

Figure 12:
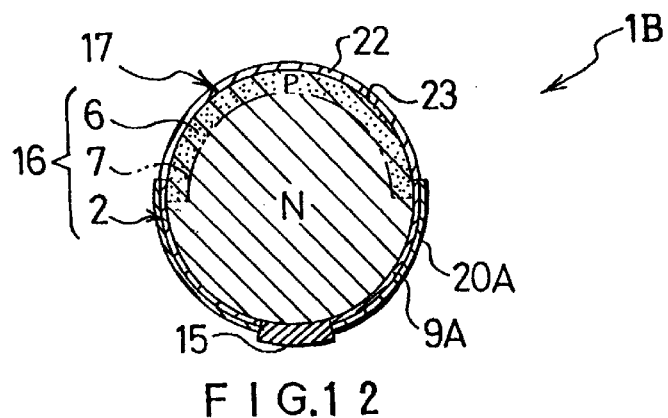

Next, semiconductor photocatalyst 1B which is a partial modification of semiconductor photocatalyst 1 will be described. However, the description of elements which have the same numerals as those which have been described previously are abbreviated. Referring to FIG. 12, a SiO2 coating 9A (thickness 0.3–0.7 micrometer) covers the surface of the lower half of spherical crystal, except at the surface of negative electrode 15. An Si3N4 coating 20A (thickness approximately 0.3–1.0 micrometer) covers the surface of coating 9A. These coatings 9A and 20A are formed by PVD or CVD method. A TiO2 electrode coating 22 (thickness approximately 0.3–0.7 micrometer) covers a large portion of the surface of p-type diffusion layer 6. TiO2 electrode coating 22 is formed so that it does not contact pn junction 7. A hetero-unction 23 is formed between p-type diffusion layer 6 and coating 22. The energy band gap of hetero-junction 23 is different from p-type diffusion layer 6.

When manufacturing semiconductor photocatalyst 1B, coatings 9A, 20A are formed over the entire surface of spherical crystal 2 including p-type diffusion layer 6. Afterwards, the areas which correspond to electrode coating 22 are removed by etching, and electrode coating 22 is formed. An opening can be formed in coatings 9A, 20A in order to form negative electrode 15. The manufacturing method is not limited to this, but semiconductor photocatalyst 1B can be manufactured by various known techniques.

When light such as sunlight or the like is shined on semiconductor photocatalyst 1B, holes accumulate at the surface of electrode coating 22. It functions as an oxidizing electrode which takes electrons at the phase boundary. The photovoltage of micro photocell 17 increases the surface electric potential of electrode coating 22. It functions in the same manner as semiconductor photocatalyst 1A of modification mode 1. Because there is no metallic positive electrode which can obstruct incident light, the entire surface of electrode coating 22 functions as an efficient photocatalyst. Because the barrier height of hetero-junction 23 is reduced by light generated carriers, the photochemical conversion efficiency is heightened.

Modification made 3 . . . (refer to FIG. 13)

Figure 13:
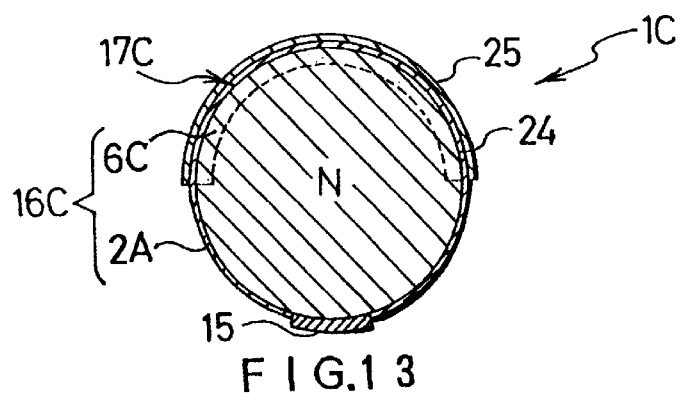

Next, semiconductor photocatalyst 1C which is a partial modification of semiconductor photocatalyst 1 will be described. However, the description of elements which have the same numerals as those which have been described previously are abbreviated. Referring to FIG. 13, spherical crystal 2A is a spherical crystal of an n-type silicon semiconductor without the p-type diffusion layer 6. On the surface of spherical crystal 2A, a SiO2 coating 24 (thickness 1.5–3.0 nm) covers the entire surface, except at negative electrode 15. A metal coating 25 (thickness approximately 10–15 nm) covers the surface of coating 24 at the top half of spherical crystal 2A. Metal coating 25 is, for example, a Ti or Ni coating. With this MIS configuration there is a bending of the energy band similar to a pn junction at the interface of spherical crystal 2A and SiO2 coating 24 underneath metal coating 25. There is formed a photovoltaic part 16C which contains an energy band bending layer 6C near the surface, and there is formed a microphotocell 17C.

Modification mode 4 . . . (refer to FIG. 14)

Figure 14:
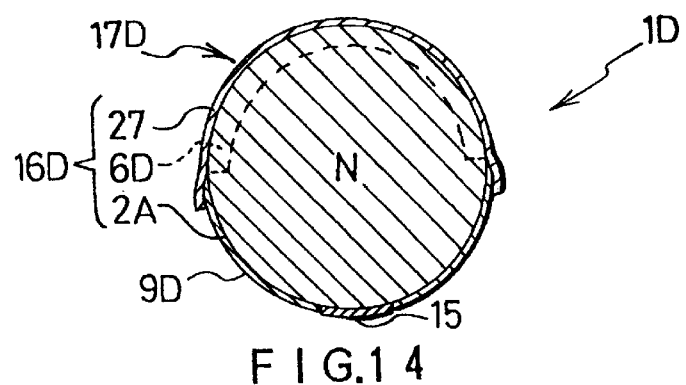
Figure 20:
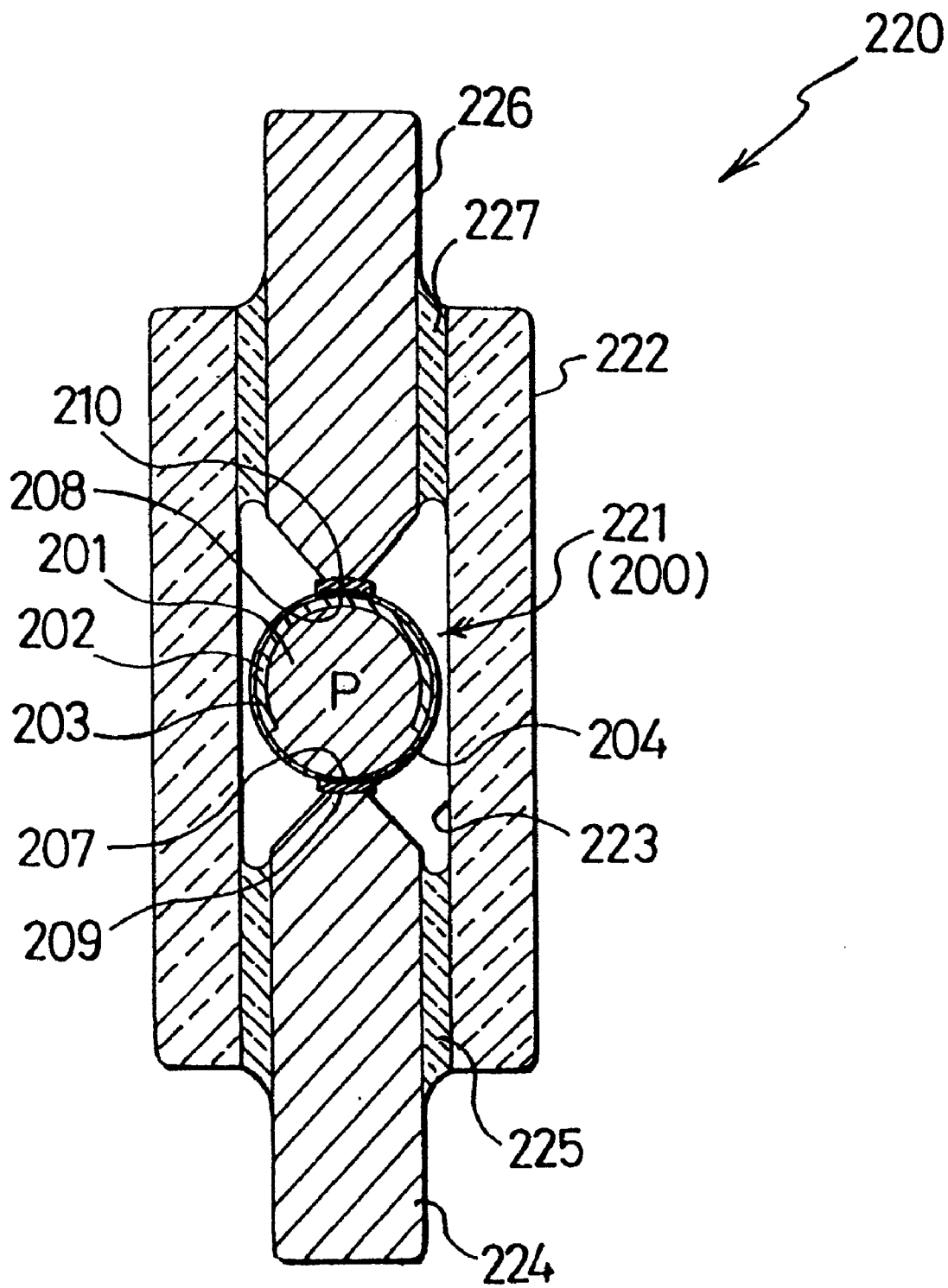
Figure 21:
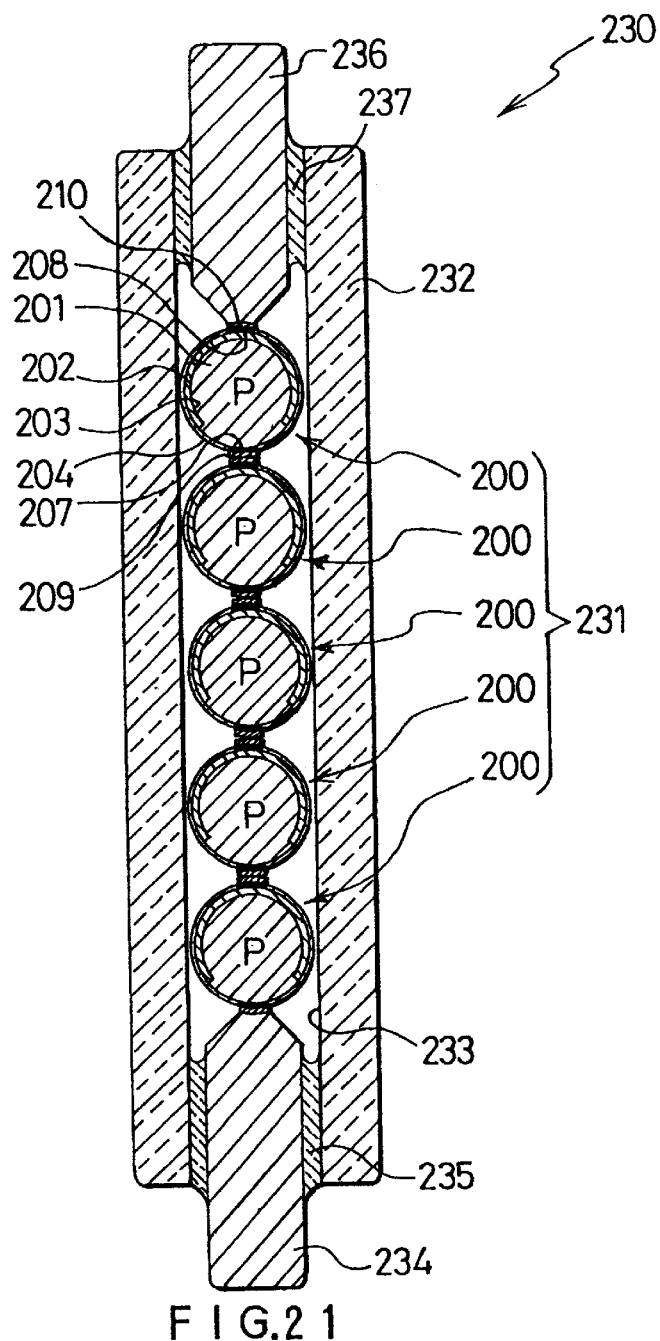
Figure 22:
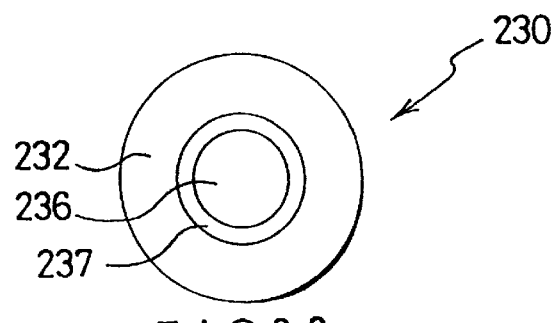

Next, semiconductor photocatalyst 1D which is a partial modification of semiconductor photocatalyst 1 will be described. However, the description of elements which have the same numerals as those which have been described previously are abbreviated. Referring to FIG. 14, spherical crystal 2A is a spherical crystal of an n-type silicon semiconductor without the p-type diffusion layer 6. On the upper half of spherical crystal 2A, a metal coating 27 (thickness approximately 10–15 nm) is formed. Metal coating 27 is, for example, a Ti or Ni coating. An SiO2 insulating coating 9D (protective film) (thickness approximately 0.3–0.7 micrometer) covers the surface of the lower half of spherical crystal 2A, except at electrode 15. With this Schottky barrier construction, there is a bending of the energy band similar to at a pn junction at the interface of spherical crystal 2A and metal coating 27. There is formed a photovoltaic part 16D which contains an energy band bending layer 6D near the surface, and there is formed a microphotocell 17D.

The semiconductor photocatalyst of the present invention is not limited to what has been described above. The following changes can be added.

(1) TiO2 coating 10 and electrode coatings 21, 22 which are used as photocatalysts and which have a large energy band gap are not absolutely necessary. TiO2 coating 10 can be omitted. For the objectives of passivation and anti-reflection, an Si3N4 coating can be formed on the surface of SiO2 coating 9 so that the entire microphotocell 17 is protected. In this case, the oxidation-reduction voltage is limited by the open circuit voltage of pn junction 7 generated between positive electrode 14 and negative electrode 15. But the catalytic action of electrodes 14, 15 still remain.

(2) Spherical crystal 2 can be constructed of p-type silicon semiconductor. Instead of a p-type diffusion layer 6, an n-type diffusion layer can be formed. Furthermore, the n-type or ptype semiconductor which is to be used for spherical crystal 2, 2A is not limited to Si semiconductor, but semiconductors of SiGe, SiC, or the like, Group III–V compound semiconductors of GaAs or InP or the like, chalcopyrite semiconductors such as CuInSe2 or the like can also be used. Pn junction 7 can be a hetero-junction. Referring to FIG. 13, this MIS configuration is only one example, and various MIS configurations can be used. Referring to FIG. 14, this Schottky barrier configurations is only one example, and various Schottky barrier configurations can be used.

(3) Materials which can be used as an anti-reflective film and which have passivating function, in addition to SiO2 and Si3N4, include the following: Al2O3, Ta2O5, TiO2, MgF2, SnO2, or Nb2O5. However, the material should be selected in relation to the material of spherical crystal 2, 2A. (4) Instead of coating 10 or electrode coatings 21, 22 of TiO2 which has a photocatalytic function, a coating of metal oxide semiconductors which have photocatalytic function can be used. These include: SrTiO3, Fe2O3, PbxTi1–xO2 or the like. Furthermore, the size of semiconductor photocatalysts 1–1D is not limited to that of the embodiments. They can be made bigger or smaller.

Electrolysis device with semiconductor photocatalyst (refer to FIGS. 15–17)

Next, an electrolysis device with a semiconductor photo-catalyst (will be referred as electrolysis device) is described. This electrolysis device uses an aggregate in which several semiconductor photocatalysts 1 are aggregated.

Referring to FIG. 15, electrolysis device 30 stores a pre-selected electrolyte solution 31. In addition, electrolysis device 30 comprises: an electrolyte solution chamber 32 (made of glass, for example) which stores a plurality of semiconductor photocatalysts 1 immersed in electrolyte solution 31; a plurality of semiconductor photocatalysts 1 which are stored at the bottom of electrolyte solution chamber 32; a right and left pair of a positive electrode 34 and a negative electrode 35 which are placed on either end inside electrolyte solution chamber 32 and which applies a common electric field to the plurality of semiconductor photocatalysts; a power supply device 36 which applies a specified serial voltage between positive electrode 34 and negative electrode 35; a glass cover 33 for collecting gas which is generated; a pipe 37 which replenishes electrolyte solution 31; a gas exit pipe 3 8 through which generated gas is removed.

When conducting electrolysis using electrolysis device 30, an aqueous solution of methanol, for example, of a specified concentration fills electrolyte solution chamber 31 to a specified depth. Sunlight 41 is shined from above, and photovoltage is generated in a plurality of semiconductor photocatalysts 1. A serial voltage is applied from positive electrode 34 to negative electrode 35 via electrolyte solution 31.

Almost all of the semiconductor photocatalysts is given a direction by the electric force as a result of the bipolar phenomenon. Negative electrode 15 of each of the semiconductor photocatalysts 1 faces towards positive electrode 34, and positive electrode 14 face toward negative electrode 35. 2–4 of the semiconductor photocatalysts become electrically connected in series. Even if the application of serial voltage is terminated afterwards, the serial connection continues. Under these conditions, electrolysis device 30 is operated. Electrolysis of electrolyte solution 31 occurs. Electrolyte solution 31 (methanol solution) is oxidized at positive electrode 14 and at the surface of TiO2 coating 10 which is in contact with positive electrode 14. The solution is reduced at the surface of negative electrode 15. As a result, CO2 gas 40 is generated at positive electrode 14 and at the surface of coating 10. H2 gas 39 is generated at the surface of negative electrode 15.

The mixture gas of generated CO2 gas 40 and H2 gas 39 is guided by cover 33 and is sent to a gas tank (not shown) from gas exit pipe 38. The mixture gas is separated by a gas separating device which is connected to the gas tank. In electrolysis device 30, the individual semiconductor photocatalysts 1 are not anchored to electrolyte solution chamber 32. When light stops shining, they can be moved independently. They can be dispersed in places where they are needed, and they can be removed and cleaned from time to time.

Here, a device which has partial modifications to electrolysis device 30 is described.

Referring to FIG. 16, in electrolysis device 30A, there is a plurality of shallow grooves 32a formed at the bottom of electrolyte solution chamber 32A. Grooves 32a house the bottoms of semiconductor photocatalysts 1. Semiconductor photocatalysts 1 are capable of movement. Two rows of semiconductor photocatalysts 1 are housed in each groove 32a. Grooves 32a continue out in a direction perpendicular to the paper. When a plurality of semiconductor photocatalysts 1 are placed into electrolyte solution chamber 32A without any electrolyte solution 31, approximately 2 rows of semiconductor photocatalysts 1 fit into each groove 32a. An electrical field is applied as before, and a plurality of semiconductor photocatalysts 1 become connected in series, two at a time, in each groove 32a. In this manner, the potential difference between the reducing and oxidizing electrodes 14, 15 can be made to be twice as large as the photovoltage of an individual semiconductor photocatalyst 1. It is easy to make modifications to have each groove 32a house two or more rows of semiconductor photocatalysts 1 in a configuration where they can be serially connected. This can be done by changing the shape of groove 32a on the bottom of electrolyte solution chamber 32A, or by placing at the bottom of electrolyte solution chamber 32A a removable member in which grooves 32a are formed. The size of the photovoltage can be specified freely. As a result, electrolysis of various types of electrolyte solutions can be conducted.

Next, a device in which partial modifications to electrolysis solution 30 have been made is described.

Referring to FIG. 17, electrolysis device 30B is a device for the electrolysis of water 31B. Because the electrolysis voltage of water is higher than that of methanol solution, there is a need to serially connect semiconductor photocatalysts 1 three at a time. At the bottom of electrolyte solution chamber 32B, a plurality of shallow grooves 32b are formed. Groove 32b can house three rows of the bottoms of semiconductor photocatalyst 1. Groove 32b continue out in a direction perpendicular to the paper. As before, by applying an electrical field from electrodes 34, 35, semiconductor photocatalysts 1 can be connected in series 3 at a time.

From positive electrode 14 and from the surface of TiO2 coating 10 of the serially connected semiconductor photocatalysts 1, O2 gas 42 is generated. From the surface of negative electrode 15, H2 gas 39 is generated. O2 gas 42 and H2 gas 39 are collected separately. On the lower surface of cover 33b, there are a plurality of semipermeable membranes 43 which partition H2 gas 39 and O2 gas 42. On cover 33B, there is a plurality of gas pathways 44 for removing H2 gas 39, and there is a plurality of gas pathways 45 for removing O2 gas 42. Gas pathway 44 is connected to a hydrogen gas tank, and gas pathway 45 is connected to an oxygen gas tank.

According to the electrolysis device 30–30B, spherical semiconductor photocatalysts 1 which are each independent are used. As a result, there are several advantages, including the following: there is no reduction in light absorption efficiency with changes in the angle of incidence of light; placing and removing of semiconductor photocatalysts 1 are convenient; it has excellent generalizability because a specified number of semiconductor photocatalysts 1 can be connected in series to generate the desired photovoltage depending on the required electrolysis voltage for the electrolysis solution.

It does not need to be stated that the various advantages of the semiconductor photocatalysts which were previously described still apply. For electrolytic devices 30–30B, semiconductor photocatalysts 1A–1D can also be used instead of semiconductor photocatalyst 1.

Embodiment 2 (Referring to FIGS. 18–28)

Referring to FIG. 18, the semiconductor device of this embodiment is composed of a single or a plurality of independent, bead-like spherical solar cell 200 (spherical semiconductor element).

Referring to FIG. 18, there is shown a cross-section of spherical solar cell 200. As an example, a spherical crystal 201 of p-type silicon semiconductor material is manufactured using semiconductor spherical crystal manufacturing device 101. Its diameter is 1.5 mm, and the resistivity is 1 ohm-cm. After forming a diffusion mask similar to one described in Embodiment 1, spherical crystal 201 is heated to 850–950 degrees C. in an atmosphere which contains P (phosphorus). By diffusing phosphorus into the surface of spherical crystal 201, and an n-type diffusion layer 202 is formed. A pn junction 203 is formed.

The dopant concentration at n-type diffusion layer 202 is $2-4 \times 10^{20}$ cm$^{-3}$. Pn junction 203 is formed at a depth of 0.5 micrometer from the surface of spherical crystal 201.

Next, after removing the SiO2 coating from the surface of spherical crystal 201, an insulating coating 204 for the purpose of surface protection and anti-reflection is formed by the CVD method. As in semiconductor photocatalyst 1, insulating coating 204 comprises, for example, a coating of SiO2 and a coating of TiO on its surface.

Next, holes 205, 206 of diameter 0.2 mm are opened at the lower end of spherical crystal 201 and at the top end of insulating coating 204. Holes 205,206 are opened by sandblasting method or the like. The silicon surface is exposed. Next, while masking everything except for the pair of holes 205, 206, a 50 nm thick Pd (palladium) coating is formed by electroless plating. Afterwards, a 2 micrometer thick Ni (nickel) coating is formed on the Pd coating. Afterwards, this is heat processed at 400 degrees C. In this manner, a positive electrode 207 which is electrically connected to the p-type silicon and a negative electrode 208 which is electrically connected to n-type diffusion layer 202 is formed. Next, the surfaces of both electrodes 207, 208 are covered with soldering films 209, 210 with an approximate thickness of 20 micrometer. Because positive electrode 207 and negative electrode 208 are formed so that they oppose each other, with the center of spherical crystal 201 in between them, it is possible to line up a plurality of solar cells 200 in a row and electrically connect them in a serial manner, as in semiconductor photocatalyst 1.

Besides using the gas diffusion method, the n-type diffusion layer 202 can be formed by a solid phase diffusion method, an ion implantation method. Insulating coating 204 can be formed by the PVD method. Furthermore, both electrodes 207, 208 can be formed by vapor deposition method. Furthermore, a p-type diffusion layer can be formed on a spherical crystal of a n-type silicon semiconductor. The material and thickness of insulating coatings 204, electrodes 207,208 can be adjusted appropriately as needed. The semiconductor which forms spherical crystal 201 is not limited to silicon semiconductors. Various semiconductors which have been listed in previous embodiments may be used.

Solar cell 200, as described above, generate photovoltage by receiving sunlight. Therefore, they can be used as semiconductor photocatalysts or solar batteries. When a plurality of solar cells 200 are placed in an electrolyte solution or in an organic gas, an electrochemical reaction is induced. The electrolyte solution or the organic gas dissociates.

In solar cell 200 which uses the silicon semiconductor, the open circuit voltage between positive electrode 207 and negative electrode 208 is approximately 0.6V at maximum. The magnitude of the open circuit voltage is limited by the energy band gap of the semiconductor used in spherical crystal 201. For example, when using a GaAs type semiconductor crystal, it becomes approximately 1.0 V. As described in Embodiment 1, the photovoltage can be increased by lining up a plurality of solar cell 200 in a row and electrically connecting them in series. Furthermore, MIS configuration or a Schottky barrier configuration can be used instead of pn junction 203.

Solar cell 200 can be incorporated into an electrical circuit and be used as a light sensor. However, when using it as a photodiode, the design needs to be altered depending on the objective. When making it into a spherical semiconductor element which functions as a light-emitting diode, spherical crystal 201 is constructed into a configuration which is similar to known light-emitting diodes, using semiconductors of GaP, GaAs, SiC, or the like. The spherical crystal has a single or a plurality of pn junctions. When current is run in the forward direction between the positive and negative electrode, there is light emitted at the pn junction. This light radiates to the outside (refer to Embodiment 3).

Modification mode 1 . . . (refer to FIG. 19)

A semiconductor device which is a partial modification of the previous semiconductor device is described. However, the description of elements which have the same numerals as those which have been described previously are abbreviated.

Referring to FIG. 19, the semiconductor device of this modification mode is constructed from a single, independent, and bead-like rectifier diode 215 (spherical semiconductor element) which is shown.

Referring to FIG. 19, there is shown a cross-sectional diagram of rectifier diode 215. A p-type diffusion layer where a p-type dopant is diffused and a pn-junction 218 is formed on a spherical crystal 216 of n-type silicon semiconductor. Insulating coating 204, negative electrode 207a, positive electrode 208a, and soldering films 209, 210 are formed as described before. Electrodes 207a, 208a can be made larger than the electrodes of solar cell 200 in FIG. 18. Instead of pn junction 218, MIS construction or Schottky barrier construction can also be used. By making appropriate design changes, they can be made into constant voltage diodes (zenerdiodes) or variable capacitance diodes.

Modification mode 2 . . . (refer to FIG. 20)

A semiconductor device relating to a modification mode will be described. However, the description of elements which have the same numerals as those which have been described previously are abbreviated. In this semiconductor device, a single, independent, and bead-like photodiode cell 221 (spherical semiconductor element) is housed inside a transparent, glass case 222. The semiconductor device is a photodiode 220 with a pair of lead pins 224, 226 as the external electrodes.

Photodiode cell 221 has approximately the same configuration as solar cell 200. A n-type diffusion layer 202 where a n-type dopant is diffused and a pn-junction 203 is formed on a spherical crystal 201 of p-type silicon semiconductor. Spherical crystal 201 has a diameter of 1.5 mm and a resistivity of around 20 ohm-cm. Insulating coating 204, electrodes 207, 208, and soldering films 209, 210 are formed as described before. However, pn junction 203 is formed at a depth of 2 micrometers from the surface of spherical crystal 201. The glass tube which is case 222 has an inner diameter of approximately 1.6 mm, an outer diameter of approximately 2.6 mm, length of approximately 5.0 mm. It is constructed from a glass which has 1K2O.PbO.SiO2 type excellent light transparency and which can be sealed at relatively low temperature. First, a positive electrode lead pin 224 (external electrode) hermetically seals one end of storage cavity 223 of case 222 by fusing with a sealing glass 225. Next, under an inert gas, photodiode cell 221 is stored in storage cavity 223 from the other end of storage cavity 223. Soldering film 209 of positive electrode 207 is brought into contact with the tip of positive electrode lead pin 224. Next, under the gas described above, negative electrode lead pin 226 (external electrode) is placed on the other end of storage cavity 223. While the tip of lead pin 226 is pressed against solder film 210 of negative electrode 208, negative electrode lead pin 226 hermetically seals storage cavity 233 by fusing with a sealing glass 227. Afterwards, by heating the entirety, positive electrode lead pin 224 and soldering film 209, negative electrode lead pin 226 and soldering film 210 are connected. Afterwards, lead pins 224, 226 are connected to an external circuit. The air space inside storage cavity 223 is filled with an inert gas. When light is shined on photodiode cell 221, there is generated a photovoltage on lead pins 224, 226, which is a function of the intensity of the light. As a result, it can be used as a light sensor. Because light can be received from all surfaces except at electrodes 207, 208, there is no limitations on the direction of incoming light.

Modification mode 3 . . . (refer to FIGS. 21, 22)

A modification mode of a semiconductor device will be described. However, the description of elements which have the same numerals as those which have been described previously are abbreviated. This semiconductor device is a solar battery device 230 which has a solar cell array 231 (semiconductor element array) in which 5 independent, bead-like, solar cells 200 (spherical semiconductor element) are lined in a row and are electrically connected in series. Solar cell array 231 is housed inside a transparent, glass case 232. Solar battery device 230 has a pair of lead pins 234,236 as external electrodes.

These solar cells 200 are the same as those shown in FIG. 18, except that they have a diameter of 0.5 mm. The glass tube for case 232 has an inner diameter of approximately 0.65 mm, an outer diameter of approximately 1.35 mm, a length of approximately 7.5 mm. It is constructed from the same glass as in modification mode 2. First, positive electrode lead pin 234 (external electrode) hermetically seals one end of storage cavity 233 of case 232 by fusing with a sealing glass 235. Next, under an inert gas, solar cell array 231 is placed inside storage cavity 235 from the other end. Soldering film 209 of positive electrode 207 of solar cell 200 at one end of solar cell array 231 is brought into contact with the tip of positive electrode lead pin 234. Next, under the same gas, negative lead pin 236 (external electrode) is placed at the other end of storage cavity 233. While the tip of lead pin 236 is pressed against solder film 210 of negative electrode 208 of the solar cell 200 at the other end, negative electrode lead pin 236 hermetically seals storage cavity 235 by fusing with a sealing glass 237. Afterwards, by heating the entirety, positive electrode lead pin 234 and soldering film 209, negative electrode lead pin 236 and soldering film 210 are electrically connected. Afterwards, lead pins 234, 236 are connected to an external circuit. The air space inside storage cavity 233 is filled with an inert gas. When light is shined on solar cell array 231, there is generated a photovoltage on lead pins 234, 236, which is a function of the intensity of the light. As with the previous photodiode, there are no limitations on the direction of incoming light. When electrically connecting solar cell array 231 in series, the five solar cells 200 are retained in a horizontal, single-column groove of a specified container. While shining light, the container is vibrated while applying an external electric field.

Figure 23:
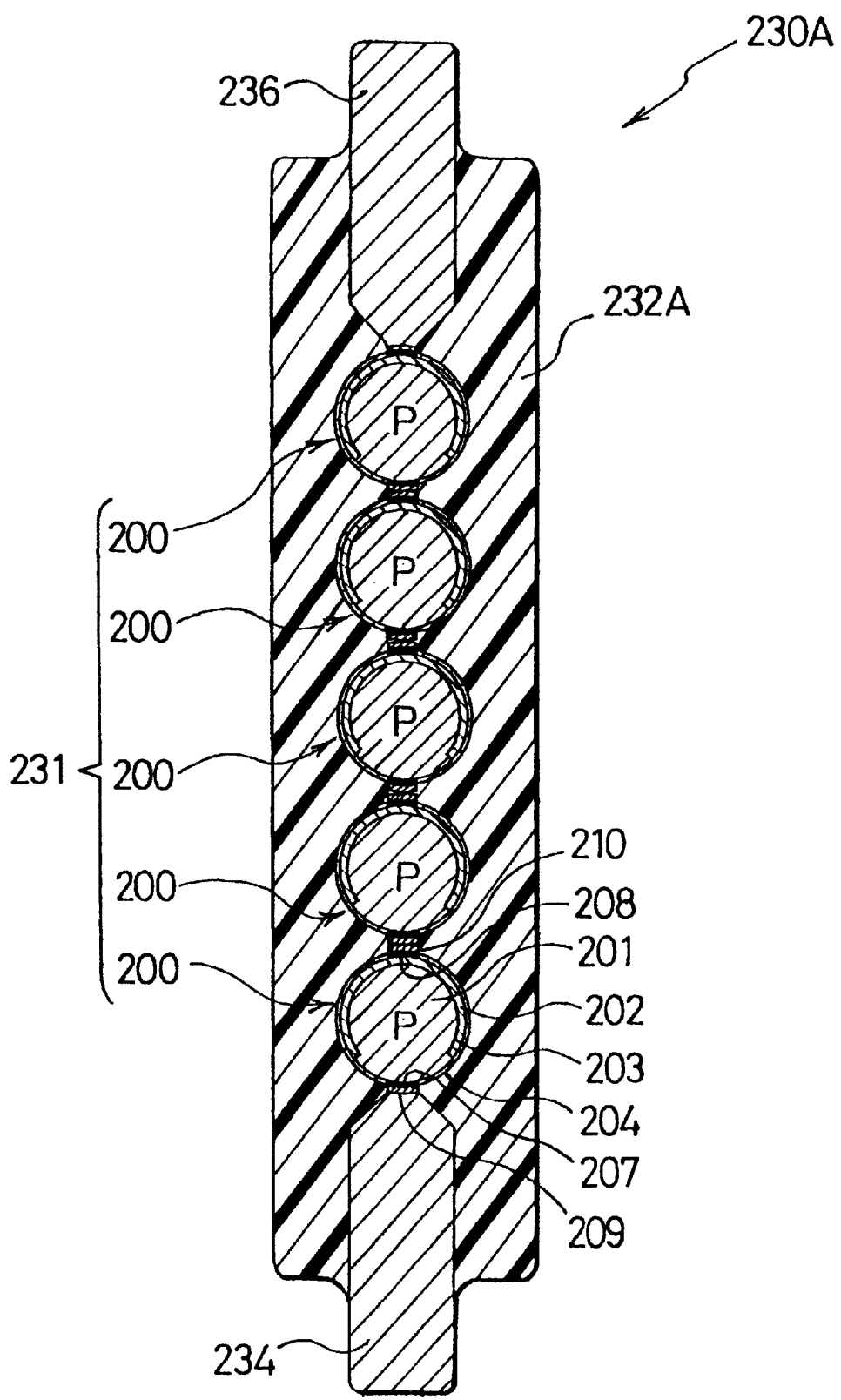

In this solar battery device 230 and in the solar battery 240 which will be described later, soldering films 209, 210 can be omitted. Instead, electrodes 207, 208 can incorporate a magnetic substance such as Ni or the like, and it can be magnetized. They can be connected by magnetism. Furthermore, for each solar cell 200, a thick film conductive synthetic resin can be used instead of soldering film 209, 210. Furthermore, an elastic metal member such as a disk spring or the like can be interposed between electrodes 207, 208 and the corresponding lead pins 234,236. Solar battery device 230A is a partial modification of solar battery device 230. Referring to FIG. 23, instead of glass case 232, a transparent synthetic resin (for example silicone resin or the like) case member 232A is used. Solar cell array 231 is imbedded in the interior of the case member.

Modification mode 4 . . . (refer to FIGS. 24, 25)

A semiconductor device which is a modification mode will be explained. However, the description of elements which have the same numerals as those which have been described previously are abbreviated. This semiconductor device is a solar battery module in which modification mode 3 has been enlarged in 2 dimensions to become sheet-like or panel-like. In a transparent case 242 which is made from the same glass as described above, 4 storage cavities are formed in parallel. Both main surfaces 242a, 242b form a wave-shaped surface and are the light-receiving surfaces. In each storage cavity 243, there is a solar cell array 241 which is the same as solar cell array 241 of modification mode 3 and a rectifier diode 215 which is the same rectifier diode 215 as in FIG. 19. Rectifier diode 215 is electrically connected in series with soldering film 210 of negative electrode 208 of solar cell 200 which is on the negative electrode side of solar cell array 241. There is positive electrode lead pin 244 on one end of each storage cavity 243, and each storage cavity 243 is sealed by sealing glass 245. The tip of each positive electrode 244 lead pin is electrically connected to soldering film 209 of positive electrode 207 of the corresponding solar cell. On the other end of each storage cavity 243, a negative electrode lead pin 246 is inserted and is sealed by sealing glass 247. The tip of each negative electrode lead pin 246 is electrically connected to soldering film 210 of negative electrode 208 of the corresponding rectifier diode 215. Furthermore, the air spaces in each storage cavity 243 is filled with an inert gas. The four positive electrode lead pins 244 and the four negative electrode lead pins 246 are each connected in parallel, and are connected to an outside circuit.

When solar cell array 241 is connected in parallel, and the output power is increased, a difference in photovoltage between solar cell arrays 241 is created. Reverse current could flow from one solar cell array 241 with a high voltage to another solar cell array 241 of a lower voltage. The purpose of having a rectifier diode 215 is to prevent overheating of solar cell array 241.

When sunlight is incident on main surfaces 242a or 242b of solar battery module 240, a photovoltage is generated in which positive electrode 207 becomes positive, and negative electrode 208 becomes negative. Between positive electrode lead pin 244 and negative electrode lead pin 246 of each row, the voltage is the sum of the photovoltages from the five solar cells 200 minus the forward voltage drop of rectifier diode 215. As a result, there is output to the outside circuit which is connected to lead pins 244, 246.

The number of serial connections in solar cell array 241 and the number of rows of solar cell array 241 can be specified freely depending on the output voltage and output current which is needed. Furthermore, main surfaces 242a, 242b of case 242 can be formed as planes. Case 242 can be constructed from a synthetic resin (for example, silicone resin or the like) which has excellent light transparency. Solar battery module 240A is a partial modification of solar battery module 240. Referring to FIGS. 26, 27, instead of case 242, a case member 242A made of a transparent synthetic resin (silicone resin or the like, for example) can be used. Each row of solar cell array 241 and rectifier diode 215 are embedded in the interior of case member 242A. Both main surfaces 248a, 248b of case member 242A are formed as parallel planes. Furthermore, referring to FIG. 27, case member 242A can have a construction in which two sheet materials are joined at the surface along dotted line 249.

In solar battery module 240 described above, both ends of each storage cavity 243 are hermetically sealed by lead pins 244, 246 and sealing glass 245, 247. The interior is filled with inert gas. Solar cell 200 is electrochemically protected. Solar cell 200 does not degrade easily and has excellent durability. This is also true for solar battery module 242A. Main surfaces 242a, 242b of case 242 have a geometrically symmetrical construction. Photovoltage is generated whether light is received from the front or the back. In order to receive light from wide angles, main surfaces 242a, 242b have curved surfaces which are like partial cylinders. As a result, it has an excellent light capturing capability with respect to light, such as sunlight, which has a fluctuating angle of incidence.

In solar battery device 230 and solar battery module 240, of the light which passes through case 232, 242, incident light which enters at an angle of incidence greater than the critical angle of incidence repeat several-fold reflections off the surfaces of nearby solar cells 200. In the end, the light is more easily absorbed in the interior, and the photoelectric conversion efficiency is improved. In solar battery module 240, of the incident light which is not photoelectrically converted, because the light passes through case 242 and is transmitted to the opposite side, solar battery module 240 can be used as a solar battery which also serves as window glass. The solar battery module of the prior art had solar cells interposed between a support plate and a transparent cover glass. This was then filled with a transparent synthetic resin. The module also had an interconnector and a moisture proof sheet. However, solar battery module 240 has excellent air-tightness and durability. Transparent synthetic resin for sealing, interconnector, moisture proof sheet, and the like are all unnecessary. As a result, it is a simple configuration.

Solar battery devices 230, 230A, and solar battery modules 240, 240A have excellent air-tightness and water tightness. Because solar cell 200 is stored inside case 232, 242, or case member 232A, 242A, this device is suited for using sunlight as an energy source while being immersed in water, various electrolyte solutions, or sewage to be processed. For example, referring to FIG. 28, there is shown a water electrolysis device 250 which has a built-in solar battery module 240. Solar battery module 240 and water 254 are stored in an electrolytic bath 251. There is a lid member 252 which covers the upper end of electrolytic bath 251. There is a barrier membrane 253 which is a semi-permeable membrane. When sunlight is shined from above, electrolysis is triggered by the photovoltage of solar battery module 240. Oxygen gas 255 is generated from the surface of positive electrode lead pin 244. Hydrogen gas 256 is generated from the surface of negative electrode lead pin 246.

Next, there will be a general description of the advantages of various semiconductor devices of Embodiment 2. Because spherical semiconductor elements of solar cell 200, rectifier diode 215 and the like are spherical particles, they have excellent mechanical strength and are difficult to damage. Because each spherical semiconductor element has a pair of electrodes 207, 208 which are opposite each other, a plurality of solar cells can be electrically connected in series easily. Because semiconductor devices can be constructed by combining various elements depending on its purpose, it is very generalizable and practical. Insulating coating 204 is formed, and because the distance between positive electrode 207 and negative electrode 208 is large, the reverse reaction is prevented. There is no optical directionality. Because there is an optical symmetry which is close to the symmetry of a sphere surface, it has excellent light capturing ability, in particular the capturing of sunlight. The same is true for light-emitting elements.

The diameter of the spherical semiconductor element is small. The area of the pn junction or the like becomes larger relative to its volume. As a result, the utilization efficiency of the semiconductor material is high. Furthermore, when manufacturing solar battery device 230 or solar battery module 240, wiring by die bonding or wire bonding is not necessary. As a result, assembly is simple, and the cost is reduced. In addition, breaking of wire connections do not occur. As described above, light absorption is increased by the multi-fold reflections, and photochemical conversion efficiency is improved. The same is true for light emitting diode arrays. Light emission is heightened by the multiple reflections. Because the diameter of spherical semiconductor elements are small, case 232, 242 can be made with a thin construction, and the overall thickness and volume become smaller. This is advantageous in terms of manufacturing costs.

Embodiment 3 (referring to FIGS. 29–34)

Figure 29:
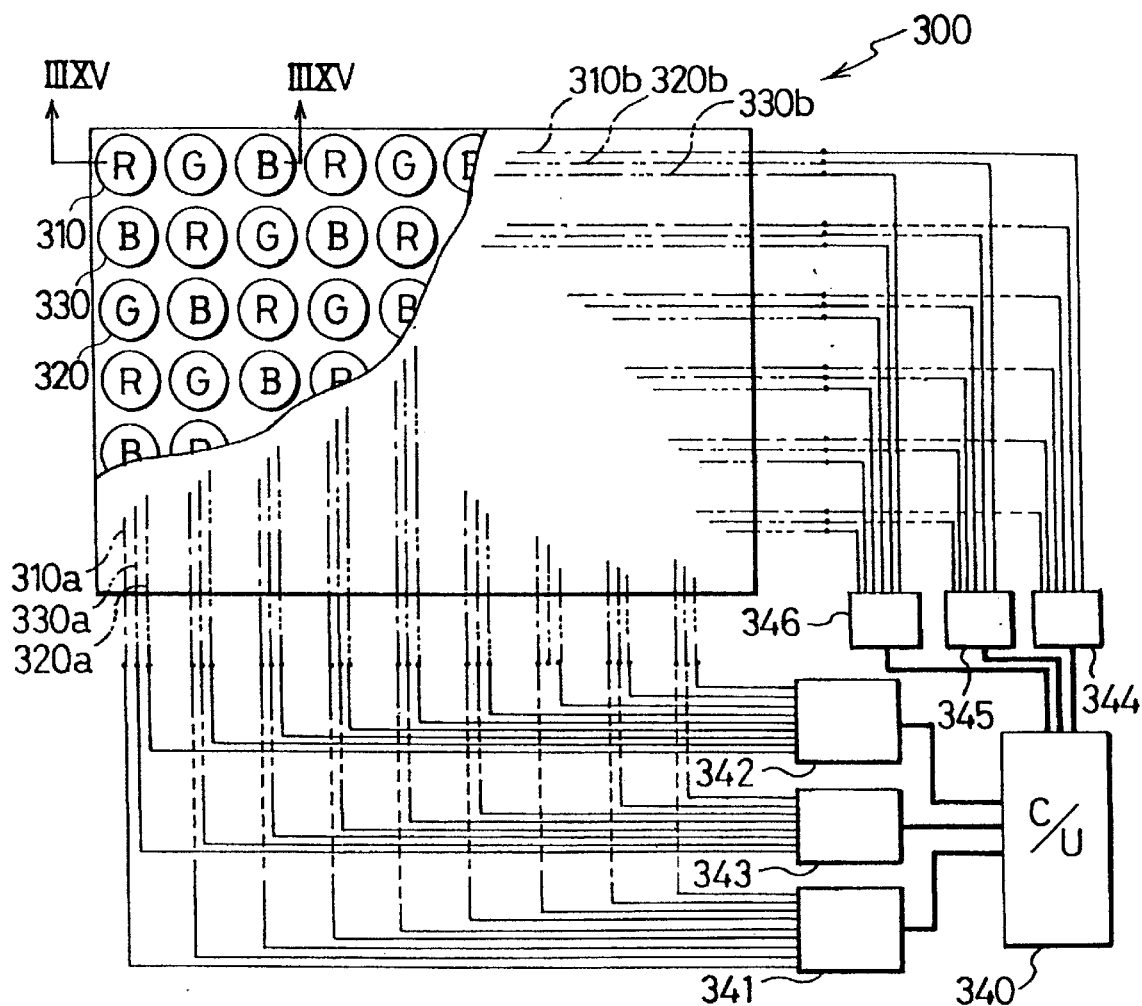
FIGS. 29–34 show Embodiment 3 of the present invention.

Referring to FIG. 29, the semiconductor device of this embodiment is a color display panel 300 which aligns light-emitting diodes into a plurality of rows and a plurality of columns. Light emitting diodes 310, 320, 330 are light emitting diodes which emit red light (R), green light (G), and blue light (13), respectively. In each row, light emitting diodes 310, 320, 330 are placed cyclically in the order of RGB. In each column, light emitting diodes 310, 330, 320 are placed cyclically in the order of RBG.

The control and driving means which drives display panel 300 and displays the color image is the same control and driving means of the known color display panel which uses three color light-emitting diodes of RGB. It will be explained briefly.

Positive electrode 315 of light-emitting diode 310 in each column is connected to a common signal line 310a (data line). A plurality of signal lines 310a are connected to a driver 341. Driving signals from driver 341 are supplied in a time series to a plurality of signal wires 310a. Negative electrode 317 of light-emitting diodes 310 of each row is connected to a common line 310b. A plurality of common line 310b is connected to driver 344. All of the voltage of common line 310b is controlled by driver 344. For example, a driving signal is outputted from a signal line 310a in the first column. When the common line 310b of the first row and the fourth row is grounded, light emitting diode 310 of first row and light emitting diode 310 of the fourth row of the first column emit light. The same is true for light emitting diodes 320, 330. There are a plurality of signals 320a, driver 342, a plurality of common lines 320b and driver 345 for the plurality of light emitting diodes 320. There are a plurality of signal lines 330a, driver 343, a plurality of common lines 330b and driver 346 for the plurality of light emitting diodes 330. Referring to FIG. 29, 30, in this way, light-emitting diodes 310, 320, 330 are connected with signal lines 310a, 320a, 330a, and to common lines 310b, 320b, 330b, respectively. A control unit 340 synchronizes and controls each of the drivers 341, 344, 342, 245, 343, 346 of each group. Furthermore, the common lines 310b, 320b, 330b do not have to be independent, but can be constructed as one common common line.

Next, the configuration and manufacturing method for light-emitting diodes 310, 320, 330 will be described.

Figure 31:
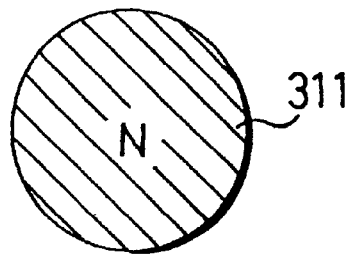

First, referring to FIG. 31, a spherical crystal 311 with a diameter of 1.5 mm is manufactured using spherical crystal manufacturing device 101 described previously. Spherical crystal 311 is of an n-type GaAs semiconductor to which Si has been added as the dopant. As will be described later, the amount of Si to be added is specified so that the infrared light which is emitted has a peak wavelength of 940–980 nm.

Figure 32:
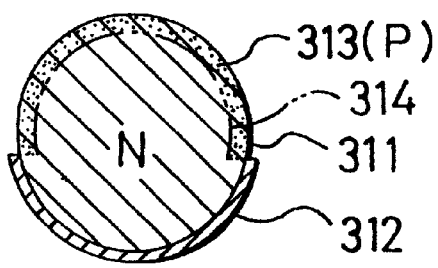

Next, a Si3N4 coating 312 (thickness approximately 0.1 micrometer) is formed over the entire surface of spherical crystal 311 by the CVD method. Referring to FIG. 32, coating 312 which is on the top half of spherical crystal 311 is removed by photoetching. Next, on the surface of the upper half of spherical crystal 311, a p-type dopant of Zn is diffused by heating, and a p-type diffusion layer 313 is formed. A pn junction 314 is formed. The concentration of dopant in p-type diffusion layer 313 is $2-8 \times 10^{19}$ cm$^{-3}$. Afterwards, Si3N4 coating 312 on the bottom half of spherical crystal 311 is removed.

Figure 33:
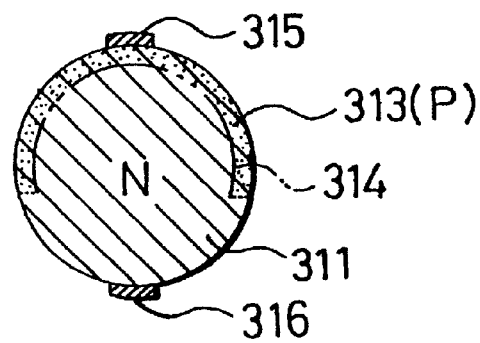

Next, referring to FIG. 33, the same things as described in embodiment 1 are done. At the top of p-type diffusion layer 313 of spherical crystal 311, an anode 315 (thickness approximately 1 micrometer) of Au with 1% of Zn is formed. At the lower end of spherical crystal 311, a cathode 316 (thickness 1 micrometer) of Au with small amounts of Ge and Ni is formed. Referring to FIG. 33, for spherical crystal 311, when a voltage of approximately 1.4 V is applied from anode 315 to cathode 316, an infrared light with a peak wavelength of 940–980 nm is emitted from pn junction 314.

Figure 34:
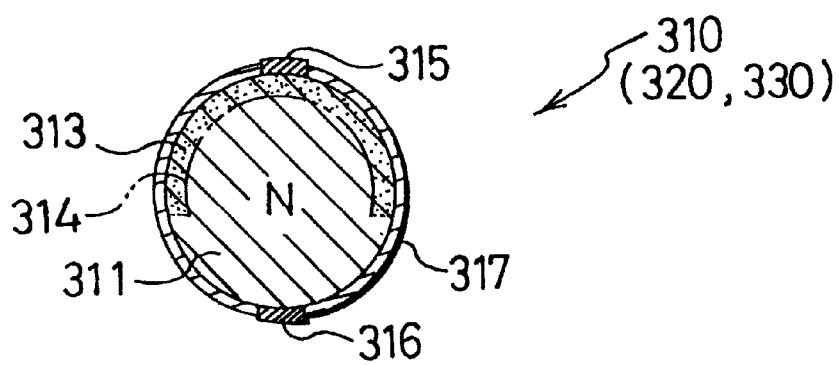

Next, referring to FIG. 34, a fluorescent coating 317 (thickness approximately 1–10 micrometer) which converts infrared light to visible light is formed over the entire surface of spherical crystal 317, except for at electrodes 315, 316. In order to form fluorescent coating 317, a fine powder of fluorescent material which is described later is mixed in with silicone resin or epoxy resin. This mixture is applied and formed into fluorescent coating 317 by heat curing. For light emitting diode 310 which emits red light, Y0.74Yb0.25Er0.01OCl is used as the fluorescent material. For light emitting diode 320 which emits green light, Y0.84Yb0.15Er0.01F3 is used as the fluorescent material. For light emitting diode 330 which emits blue light, Y0.65Yb0.35Tm0.001F3 is used. Other than fluorescent coating 317, light-emitting diodes 310, 320, 330 have the same construction. This is advantageous in the case of mass production. When a voltage of approximately 1.4 V is applied from anode 315 to cathode 316, an infrared light of wavelength 940–980 nm is emitted from pn junction 314 of GaAs. The fluorescent material in fluorescent coating 317 on the surface of spherical crystal 311 absorbs this infrared light. The fluorescent material is excited. Depending on the type of fluorescent material, the infrared light is converted to a wavelength in the visible spectrum and sent out from spherical crystal 311. In this way, red light is emitted from light emitting diode 310, green light is emitted from light emitting diode 320, blue light is emitted from light emitting diode 330. The diameter of light emitting diodes 310, 320, 330 is not limited to the diameter described above (1.5 mm). The diameter can be chosen freely. However, if it is too small, handling becomes tedious. If it is too large, the manufacturing of spherical crystals becomes difficult. The size can be set as desired in the range of 200 micrometer—3.0 mm.

Next, for the construction of display panel 300, the construction other than of light-emitting diodes 310, 320, 330 will be described. Referring to FIG. 35, display panel 300 has abase plate 347, a middle plate 348 and a surface plate 349. Base plate 347 comprises: a transparent glass plate 350 with a thickness of approximately 1.0 mm; signal wires 310a, 320a, 330a which are on the surface of glass plate 350 and which are of an Au coating; aNi reflective coating 351 on the under surface of glass plate 350. Signal lines 310a, 320a, 330a are formed by methods such as Au coating vapor deposition, masking, and etching, or the like. Reflective coating 351 is formed by vapor deposition. Base plate 347 is manufactured and prepared in advance.

Middle plate 348 comprises: a synthetic resin plate 352 of silicone resin or the like and with a thickness of approximately 1.5 mm as an example; cylindrical cavities 353 which are formed on synthetic resin plate 352 with multiple columns and multiple rows; aNi reflective coating 354 which is formed on the inner perimeter of each cylindrical cavity. First, a plurality of columns and rows of cylindrical cavity 353 are formed on synthetic resin plate 352 by stamping, drilling with laser lights, or by etching. In the inner surface of all of cylindrical cavities 353, a reflective coating 354 is formed by vapor deposition. Middle plate 348 is manufactured and prepared in advance. Surface plate 349 comprises: a transparent glass plate 355 of approximate thickness 1.0 mm, common lines 310*b*, 320*b*, 330*b* which are on the under surface of glass plate 355 and which are made of Au coating. Common lines 310*b*, 320*b*, 330*b* can be formed using methods such as vapor deposition of Au coating, masking, etching or the like. Surface plate 349 is manufactured and prepared in advance.

When assembling display panel 300, middle plate 348 is positioned on top of base plate 347 and is glued with a heat resistant adhesive. Next, in each of the multi-row, multi-column cylindrical cavity 353, the corresponding light emitting diode (one of light emitting diode 310, 320, 330) is incorporated. Next, surface plate 349 is positioned on top of middle plate 348 and is glued with a heat resistant adhesive. Finally, everything is heated, and each anode 315 is connected to the corresponding signal line 310*a*, 320*a*, 330*a*. Each cathode 316 is connected with the corresponding common line 310*b*, 320*b*, 330*b*. Display panel 300 which has been described is used in various uses including televisions, personal computers, word processor displays, small-scale liquid crystal display with a variety of uses, display replacing light emitting diode display, large size television, displays, monitors, or the like. Depending on the purpose of the display panel, the diameters of light emitting diodes 310, 320, 330, light emitting characteristic, the number of columns and the number of rows can be chosen as appropriate. A full color display was described as an example of a display, but it can be constructed for a monochromatic display where one type of light emitting diode is incorporated. Or a display with 2 types of light-emitting diodes can be constructed.

Figure 30:
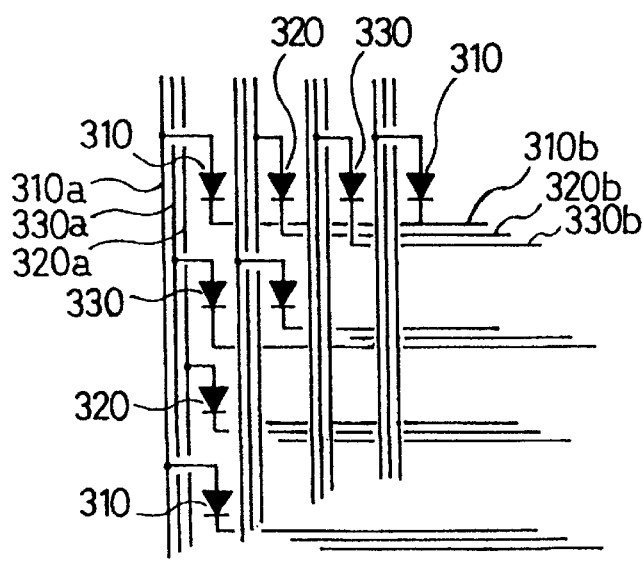

Display panel 300 is a panel-like display with the overall thickness being approximately 2–3 times the diameter of light-emitting diodes 310, 320, 330. It is compact and light weight. The light emitting diodes 310, 320, 330 which are to be built into display panel 300 can be tested beforehand, and defective products can be removed. Furthermore, with regard to signal lines 310*a*, 320*a*, 330*a* and common lines 310*b*, 320*b*, 330*b* of surface plate 349, these can also be tested beforehand, and defective products can be removed. As a result, display panel 300 can be assembled with excellent reliability. Because the three types of light-emitting diodes 310, 320, 330 can be driven by a common driving voltage (approximately 1.4 V), each of the three common lines 310*b*, 320*b*, 330*b* can be constructed as one common line. The configuration of the driving and controlling circuit is simplified. Because bead-like spherical light-emitting diodes 310, 320, 300 can be mass produced relatively cheaply, display panel 300 can be manufactured relatively cheaply. Furthermore, depending on the required resolution of display panel 300, the sizes of light emitting diodes 310, 320, 330 can be adjusted appropriately. There is a high degree of freedom in design, and a display panel which is suited for its purpose can be produced. Referring to FIG. 30, this is only one example of a display panel 300. Various design changes can be made.

What is claimed is:

1. A semiconductor device utilizing independent and bead-like spherical semiconductor elements comprising:

a spherical crystal of p-type semiconductor or n-type semiconductor;

a photovoltaic part which is incorporated onto the surface or onto an area near the surface of said spherical crystal;

said photovoltaic part generating photovoltage in association with said spherical crystal;

at least one pair of electrodes which is on both sides of the photovoltaic part and which is on the surface of said spherical crystal;

said pair of electrodes being mutually separated;

an electrode with one polarity and an electrode with the other polarity;

said pair of electrodes are placed so that they are at least partially opposite each other; the center of said spherical crystal is interposed between said pair of electrodes;

said photovoltaic part includes a diffusion layer which is formed near the surface of said spherical crystal;

a pn junction which is between said diffusion layer and said semiconductor crystal;

a transparent case which has a storage cavity which stores a single spherical semiconductor element;

a pair of external electrodes which is partially inserted into both sides of said storage cavity and hermetically seals said cavity; and said pair of external electrodes being electrically connected to electrodes of each of said spherical semiconductor elements.

2. A semiconductor device comprising:

a bead-like spherical crystal semiconductor element;

said bead-like spherical crystal semiconductor element is at least one of a p-type semiconductor and an n-type semiconductor;

a photovoltaic portion for generating a photovoltage:

said photovoltaic portion being substantially on the surface of said bead-like spherical crystal semiconductor element;

at least a first electrode being disposed only on said bead-like spherical crystal semiconductor element;

at least a second electrode being disposed only on said bead-like spherical crystal semiconductor element;

said first electrode being electrically isolated from said second electrode;

said first electrode having one polarity;

said second electrode having the other polarity;

said first and second electrodes are placed so that they are at least partially opposite each other; and the center of said bead-like spherical crystal semiconductor element is interposed between said first and second electrodes.

3. A semiconductor device as described in claim 2, wherein said photovoltaic part comprises:

a diffusion layer which is formed near the surface of said bead-like spherical crystal semiconductor element; and a pn junction which is between said diffusion layer and said bead-like spherical crystal semiconductor element.

4. A semiconductor device as described in claim 2, wherein:
said photovoltaic portion has an MIS configuration, wherein:
an insulating coating is formed on a portion of the surface of said bead-like spherical crystal semiconductor element;
a metal coating is formed on the surface of said insulating coating; and
said metal coating serves as said first electrode of one polarity.

5. A semiconductor device as described in claim 2, wherein:
said photovoltaic portion has a Schottky barrier configuration, wherein:
a metal coating is formed on a portion of the surface of said bead-like spherical crystal semiconductor element; and
said metal coating serves as said first electrode of one polarity.

6. A semiconductor device as described in claim 2, wherein:
said bead-like spherical crystal semiconductor element is a semiconductor photocatalyst; whereby said semiconductor photocatalyst generates a photovoltage when said photovoltaic portion receives light and, said semiconductor photocatalyst generates an electrochemical reaction between said first and second electrodes and an electrolyte solution.

7. A semiconductor device as described in claim 6, wherein:
said semiconductor device comprises a plurality of said bead-like spherical crystals semiconductor elements, whereby said semiconductor device is operated while at least two bead-like spherical crystal semiconductor elements are connected electrically in series via said photovoltage generated by said photovoltaic portion of said at least two bead-like spherical crystal semiconductor elements which are in said electrolyte solution.

8. A semiconductor device as described in claim 6, further comprising:
a first surface substantially covering said bead-like spherical crystal semiconductor element, other than at said first and second electrodes; and
said first surface is covered with an insulating coating which is light transparent and has anti-reflective properties.

9. A semiconductor device as described in claim 8, wherein:
a second surface on said first surface;
said second surface is covered with a light-transparent coating which is connected to said first electrode of one polarity; and
said light-transparent coating is made of metal oxide semiconductor which has a photocatalytic function.

10. A semiconductor device as described in claim 8, wherein:
the surface of said first electrode of one polarity and at least a portion of said first surface is covered with a light-transparent electrode coating; and
said electrode coating is made of metal oxide semiconductor which has a photocatalytic function.

11. A semiconductor device as described in claim 8, wherein:
said first electrode of one polarity is constructed from a light-transparent electrode coating;
said electrode coating is formed on the surface of said diffusion layer and forms a hetero-junction with respect to said diffusion layer; and
said electrode coating is made of metal oxide semiconductor which has a photocatalytic function.

12. A semiconductor device as described in claim 2, wherein:
said bead-like spherical crystal semiconductor element is selected from the group of semiconductors consisting of Si, SiGe, Group III–V compound semiconductor GaAs, InP chalcopyrite-type semiconductor and CuInSe2.

13. A semiconductor device utilizing independent and bead-like spherical semiconductor elements comprising:
a spherical crystal of p-type semiconductor or n-type semiconductor;
a photovoltaic part which is incorporated onto the surface or onto an area near the surface of said spherical crystal;
said photovoltaic part generating photovoltage in association with said spherical crystal;
at least one pair of electrodes which is on both sides of the photovoltaic part and which is on the surface of said spherical crystal;
said pair of electrodes being mutually separated;
an electrode with one polarity and an electrode with the other polarity;
said pair of electrodes are placed so that they are at least partially opposite each other;
the center of said spherical crystal is interposed between said pair of electrodes;
said photovoltaic part includes a diffusion layer which is formed near the surface of said spherical crystal;
a pn junction which is between said diffusion layer and said semiconductor crystal;
a semiconductor element array in which a plurality of said spherical semiconductor elements is electrically connected in series and is lined up in a single row;
a transparent case which has a storage cavity which stores said semiconductor element array;
a pair of external electrodes which is partially inserted onto both sides of said storage cavity of said case and hermetically seals said cavity; and
said pair of electrodes being electrically connected to each of the electrodes of said spherical semiconductor elements which are on both ends of said semiconductor array.

14. A semiconductor device as described in claim 13, wherein:
a plurality of storage cavities are formed in parallel in said case;
said semiconductor element array is placed in each storage cavity; and
a pair of external electrodes is placed on both ends of each storage cavity.

15. A semiconductor device as described in claim 2, comprising:
a semiconductor element array in which a plurality of said bead-like spherical crystal semiconductor elements are electrically connected in series and lined up in a single row;
a pair of external electrodes being electrically connected to each of said first and second electrodes of said bead-like spherical crystal semiconductor elements which are on both ends of said semiconductor array respectively; and a transparent case member which covers the exterior of said semiconductor element array.

16. A semiconductor device as described in claim 15, wherein:

a plurality of said semiconductor element arrays are placed in parallel;

said plurality of semiconductor element arrays are stored in an imbedded state inside said case member; and there are a plurality of pairs of electrodes corresponding to said plurality of semiconductor element arrays.

17. A semiconductor device, comprising:

a spherical crystal semiconductor element which is independent and bead-like;

said spherical crystal semiconductor element is at least one of a p-type semiconductor and n-type semiconductor;

a diffusion layer and a pn junction being substantially on the surface of said spherical crystal semiconductor element;

at least one pair of electrodes on both sides of said pn junction and only on the surface of said spherical crystal;

said pair of electrodes being mutually separated;

said pair of electrodes are placed so that they are at least partially opposite each other; and the center of said bead-like spherical crystal semiconductor element is interposed between said pair of electrodes.

18. A semiconductor device as described in claim 17, wherein:

the surface of said spherical crystal semiconductor element, other than at said at least one pair of electrodes, is covered with an insulating coating which is light transparent.

19. A semiconductor device as described in claim 18, wherein:

said at least one pair of electrodes includes a first electrode with one polarity and a second electrode with the other polarity.

20. A semiconductor device as described in claim 19, comprising:

a transparent case which has a storage cavity which stores one of said spherical semiconductor element;

a pair of external electrodes which is partially inserted onto both ends of said storage cavity and which hermetically seals said cavity;

said pair of external electrodes being connected electrically to said electrodes of each of said spherical semiconductor elements.

21. A semiconductor device as described in claim 19, comprising:

a semiconductor element array in which a plurality of said spherical semiconductor elements is electrically connected in series and is lined up in a single row;

a transparent case which has a storage cavity which stores said semiconductor element array;

a pair of external electrodes which is partially inserted onto both sides of said storage cavity of said case and hermetically seals said cavity; and said pair of external electrodes being electrically connected to each of said electrodes of said spherical semiconductor elements which are on both ends of said semiconductor array.

22. A semiconductor device as described in claim 21, wherein:

a plurality of storage cavities are formed in parallel in said case;

a semiconductor element array is placed in each storage cavity; and a pair of external electrodes is placed on either end of each storage cavity.

23. A semiconductor device as described in claim 19, comprising:

a semiconductor element array in which a plurality of said spherical semiconductor elements is electrically connected in series and is lined up in a single row;

a pair of external electrodes which is electrically connected to each of said electrodes of said spherical semiconductor elements which are on both ends of said semiconductor array; and a transparent case member which covers the exterior of said semiconductor element array.

24. A semiconductor device as described in claim 23, wherein:

there are a plurality of rows of said semiconductor element arrays;

said plurality of semiconductor element arrays are embedded in said transparent sheet-like case member; and there are a plurality of pairs of electrodes which correspond to said plurality of semiconductor element arrays.

25. A semiconductor device as described in claim 19, wherein:

said semiconductor device is a device which has a light emitting function in which light is emitted by applying voltage to said spherical crystal semiconductor elements.

26. A semiconductor device as described in claim 17, wherein:

a plurality of said spherical crystal semiconductor elements arranged in a matrix of a plurality of rows and a plurality of columns;

said plurality of spherical crystal semiconductor elements are housed in a case member which is transparent and panel-like; and light is emitted by selectively applying voltage to a pair of electrodes of each individual semiconductor element whereby said semiconductor device functions as a light emitting display panel.

27. A semiconductor device as described in claim 26, comprising:

a first plurality of spherical crystal semiconductor elements capable of emitting red light;

a second plurality of spherical crystal semiconductor elements capable of emitting green light;

a third plurality of spherical semiconductor elements capable of emitting blue light; and said first, second and third plurality of spherical crystal semiconductor elements alternate in a cycle in the row direction of said matrix and the column direction of said matrix.

28. A semiconductor device as described in claim 27, wherein:

each spherical crystal semiconductor element in said first, second and third plurality of spherical crystal semiconductor elements are n-type GaAs semiconductors; and said diffusion layer on said spherical crystal semiconductor element contains Zn as the p-type dopant.

29. A semiconductor device as described in claim 28, wherein:
said first plurality of spherical crystal semiconductor elements has a coating which contains a phosphor which converts infrared light to red light;
said second plurality of spherical crystal semiconductor elements has a coating which contains a phosphor which converts infrared light to green light; and
said third plurality of spherical crystal semiconductor elements has a coating which contains a phosphor which converts infrared light to blue light.

30. A semiconductor device as described in claim 2, comprising:
a transparent case which has a storage cavity which stores a single bead-like spherical crystal semiconductor element;
a pair of external electrodes which are partially inserted into both sides of said storage cavity hermetically sealing said storage cavity; and
said pair of external electrodes being electrically connected to said first and second electrodes of each of said bead-like spherical crystal semiconductor elements.

31. A semiconductor device as described in claim 2, comprising:
a semiconductor element array in which a plurality of said bead-like spherical crystal semiconductor elements are electrically connected in series and lined up in a single row;
a transparent case which has a storage cavity which stores said semiconductor element array;
a pair of external electrodes which is partially inserted onto both sides of said storage cavity of said case hermetically sealing said storage cavity; and
said pair of electrodes being electrically connected to said first and second electrodes of said bead-like spherical crystal semiconductor elements which are on both ends of said semiconductor array respectively.

32. A semiconductor device as described in claim 13, wherein:
a plurality of said storage cavities are formed in parallel in said case;
said semiconductor element array is placed in each said storage cavity; and
a pair of external electrodes is placed on both ends of each said storage cavity.

33. A semiconductor device as described in claim 2, comprising:
a semiconductor element array in which a plurality of said bead-like spherical crystal semiconductor elements are placed in parallel;
a plurality of said semiconductor element arrays;
a transparent case member which covers the exterior of said semiconductor element array;
said plurality of said semiconductor element arrays are stored in an imbedded state inside said case member; and
a plurality of pairs of electrodes electrically connected to said plurality of semiconductor element arrays.

34. A semiconductor device as described in claim 19, comprising:
a transparent case which has a storage cavity which stores one of said spherical crystal semiconductor elements;
a pair of external electrodes which is partially inserted onto both ends of said storage cavity and which hermetically seals said cavity;
said pair of external electrodes being connected electrically to said first and second electrodes of each of said spherical crystal semiconductor elements.

35. A semiconductor device as described in claim 19, comprising:
a semiconductor element array in which a plurality of said spherical crystal semiconductor elements are electrically connected in series and lined up in a single row;
a transparent case which has a storage cavity which stores said semiconductor element array;
a pair of external electrodes which is partially inserted onto both sides of said storage cavity of said case hermetically sealing said storage cavity; and
said pair of external electrodes being electrically connected to said first and second electrodes of said spherical crystal semiconductor elements which are on both ends of said semiconductor element array.

36. A semiconductor device as described in claim 21, further comprising:
a plurality of said storage cavities in parallel in said case;
each of said storage cavities including at least a single said spherical crystal semiconductor element; and
a pair of external electrodes on either end of each said storage cavity.

37. A semiconductor device as described in claim 23, further comprising:
a plurality of said semiconductor element arrays arranged in rows;
said plurality of semiconductor element arrays are embedded in said transparent case member; and
a plurality of pairs of electrodes which correspond to said plurality of semiconductor element arrays.

* * * * *